(12) United States Patent
Cilfone et al.

(10) Patent No.: US 9,110,819 B2
(45) Date of Patent: *Aug. 18, 2015

(54) ADJUSTING DATA DISPERSAL IN A DISPERSED STORAGE NETWORK

(71) Applicant: CLEVERSAFE, INC., Chicago, IL (US)

(72) Inventors: Bart Cilfone, Chicago, IL (US); Jason K. Resch, Chicago, IL (US); S. Christopher Gladwin, Chicago, IL (US)

(73) Assignee: Cleversafe, Inc., Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/148,652

(22) Filed: Jan. 6, 2014

(65) Prior Publication Data

US 2014/0122969 A1 May 1, 2014

Related U.S. Application Data

(63) Continuation of application No. 13/946,136, filed on Jul. 19, 2013, now Pat. No. 8,627,178, which is a continuation of application No. 12/983,214, filed on Dec. 31, 2010, now Pat. No. 8,495,466.

(60) Provisional application No. 61/314,166, filed on Mar. 16, 2010.

(51) Int. Cl.
| | |
|---|---|
| *G06F 11/00* | (2006.01) |
| *G06F 11/10* | (2006.01) |
| *G06F 11/20* | (2006.01) |
| *H03M 13/35* | (2006.01) |
| *H04N 21/218* | (2011.01) |

(52) U.S. Cl.
CPC ............ *G06F 11/10* (2013.01); *G06F 11/1076* (2013.01); *G06F 11/2094* (2013.01); *G06F 2211/1028* (2013.01); *H03M 13/35* (2013.01);*H03M 13/356* (2013.01); *H04N 21/2181* (2013.01)

(58) Field of Classification Search
CPC .. G06F 11/10; G06F 11/1076; G06F 11/2094
See application file for complete search history.

(56) References Cited

U.S. PATENT DOCUMENTS

| 5,774,643 A | * | 6/1998 | Lubbers et al. ................. 714/20 |
| 7,636,724 B2 | | 12/2009 | de la Torre et al. |

(Continued)

OTHER PUBLICATIONS

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

*Primary Examiner* — Charles Ehne

(74) *Attorney, Agent, or Firm* — Garlick & Markison; Timothy W. Markison

(57) ABSTRACT

A method begins with a processing module determining that storage of data requires updating, wherein the data is stored as a plurality of sets of encoded data slices in DSN memory. For a first type of updating, the processing module increases the total number while maintaining the decode threshold number. The processing module then, for each set of encoded data slices, creates another encoded data slice in accordance with the dispersed storage error encoding function and the increased total number and sends the new encoded data slices to the DSN memory. For a second type of updating, the processing module increases the total number and the decode threshold number. The processing module then recovers the data and encodes it in accordance with the dispersed storage error encoding function using the increased total number and the increased decode threshold number to produce an updated plurality of sets of encoded data slices.

16 Claims, 13 Drawing Sheets

(56) References Cited

U.S. PATENT DOCUMENTS

| | | | |
|---|---|---|---|
| 8,527,705 B2* | 9/2013 | Gladwin et al. | 711/118 |
| 2002/0194427 A1* | 12/2002 | Hashemi | 711/114 |
| 2003/0018927 A1* | 1/2003 | Gadir et al. | 714/4 |
| 2007/0079081 A1* | 4/2007 | Gladwin et al. | 711/154 |
| 2007/0079082 A1* | 4/2007 | Gladwin et al. | 711/154 |
| 2010/0241920 A1* | 9/2010 | Nonogaki | 714/752 |

\* cited by examiner computing system 10

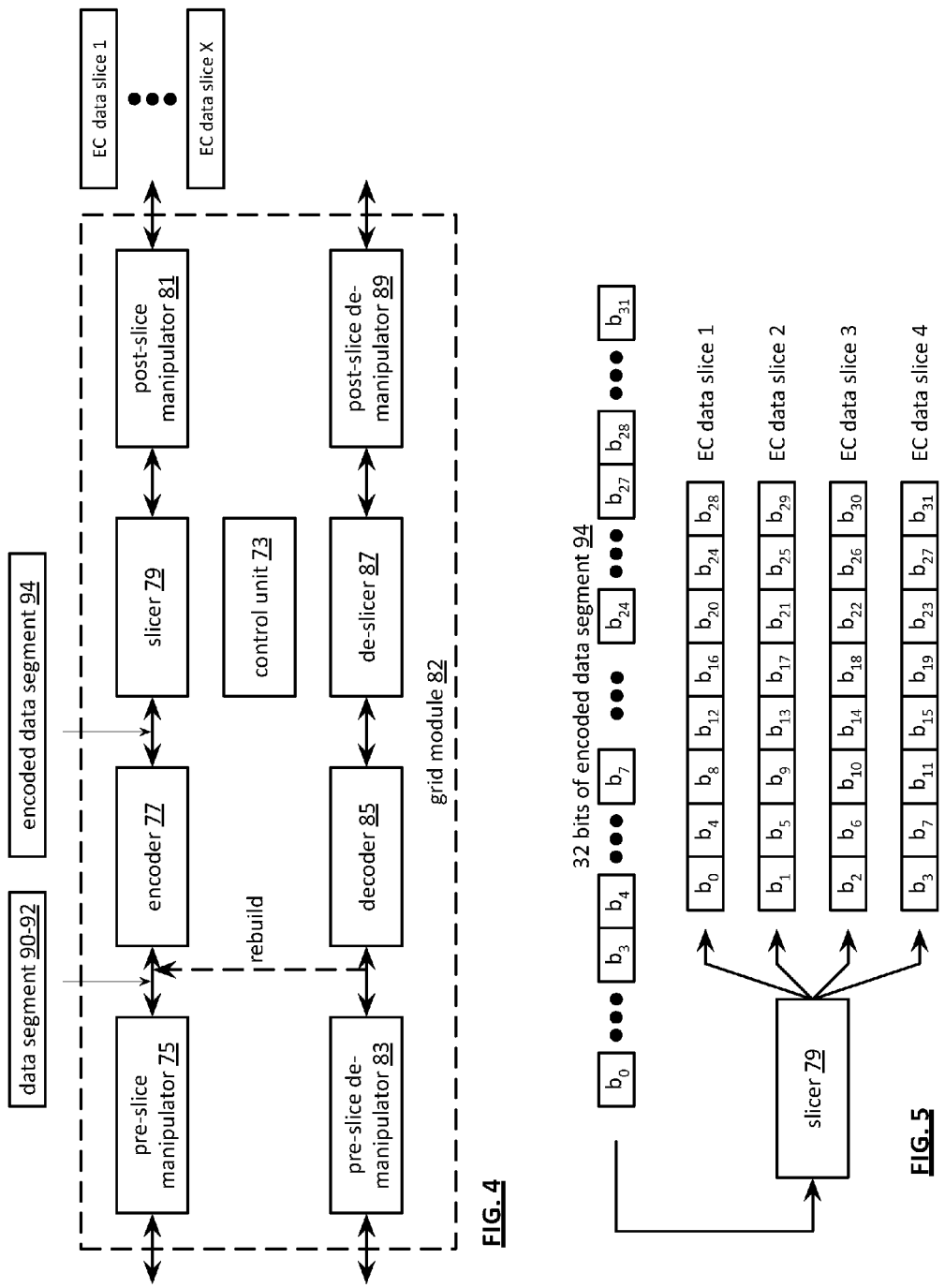

US 9,110,819 B2

ADJUSTING DATA DISPERSAL IN A DISPERSED STORAGE NETWORK

CROSS REFERENCE TO RELATED PATENTS

The present U.S. Utility patent application claims priority pursuant to 35 U.S.C. §120 as a continuation of U.S. Utility application Ser. No. 13/946,136, entitled "ADJUSTING DATA DISPERSAL IN A DISPERSED STORAGE NETWORK," filed Jul. 19, 2013, issuing as U.S. Pat. No. 8,627,178, on Jan. 7, 2014, which is a continuation of U.S. Utility application Ser. No. 12/983,214, entitled "ADJUSTING DATA DISPERSAL IN A DISPERSED STORAGE NETWORK," filed Dec. 31, 2010, now U.S. Pat. No. 8,495,466, issued on Jul. 23, 2013, which claims priority pursuant to 35 U.S.C. §119(e) to U.S. Provisional Application No. 61/314,166, entitled "STORAGE AND RETRIEVAL IN A DISTRIBUTED STORAGE SYSTEM," filed Mar. 16, 2010, all of which are hereby incorporated herein by reference in their entirety and made part of the present U.S. Utility patent application for all purposes.

STATEMENT REGARDING FEDERALLY SPONSORED RESEARCH OR DEVELOPMENT

Not applicable

INCORPORATION-BY-REFERENCE OF MATERIAL SUBMITTED ON A COMPACT DISC

Not applicable

BACKGROUND OF THE INVENTION

1. Technical Field of the Invention

This invention relates generally to computing systems and more particularly to data storage solutions within such computing systems.

2. Description of Related Art

Computers are known to communicate, process, and store data. Such computers range from wireless smart phones to data centers that support millions of web searches, stock trades, or on-line purchases every day. In general, a computing system generates data and/or manipulates data from one form into another. For instance, an image sensor of the computing system generates raw picture data and, using an image compression program (e.g., JPEG, MPEG, etc.), the computing system manipulates the raw picture data into a standardized compressed image.

With continued advances in processing speed and communication speed, computers are capable of processing real time multimedia data for applications ranging from simple voice communications to streaming high definition video. As such, general-purpose information appliances are replacing purpose-built communications devices (e.g., a telephone). For example, smart phones can support telephony communications but they are also capable of text messaging and accessing the internet to perform functions including email, web browsing, remote applications access, and media communications (e.g., telephony voice, image transfer, music files, video files, real time video streaming. etc.).

Each type of computer is constructed and operates in accordance with one or more communication, processing, and storage standards. As a result of standardization and with advances in technology, more and more information content is being converted into digital formats. For example, more digital cameras are now being sold than film cameras, thus producing more digital pictures. As another example, web-based programming is becoming an alternative to over the air television broadcasts and/or cable broadcasts. As further examples, papers, books, video entertainment, home video, etc. are now being stored digitally, which increases the demand on the storage function of computers.

A typical computer storage system includes one or more memory devices aligned with the needs of the various operational aspects of the computer's processing and communication functions. Generally, the immediacy of access dictates what type of memory device is used. For example, random access memory (RAM) memory can be accessed in any random order with a constant response time, thus it is typically used for cache memory and main memory. By contrast, memory device technologies that require physical movement such as magnetic disks, tapes, and optical discs, have a variable response time as the physical movement can take longer than the data transfer, thus they are typically used for secondary memory (e.g., hard drive, backup memory, etc.).

A computer's storage system will be compliant with one or more computer storage standards that include, but are not limited to, network file system (NFS), flash file system (FFS), disk file system (DFS), small computer system interface (SCSI), internet small computer system interface (iSCSI), file transfer protocol (FTP), and web-based distributed authoring and versioning (WebDAV). These standards specify the data storage format (e.g., files, data objects, data blocks, directories, etc.) and interfacing between the computer's processing function and its storage system, which is a primary function of the computer's memory controller.

Despite the standardization of the computer and its storage system, memory devices fail; especially commercial grade memory devices that utilize technologies incorporating physical movement (e.g., a disc drive). For example, it is fairly common for a disc drive to routinely suffer from bit level corruption and to completely fail after three years of use. One solution is to utilize a higher-grade disc drive, which adds significant cost to a computer.

Another solution is to utilize multiple levels of redundant disc drives to replicate the data into two or more copies. One such redundant drive approach is called redundant array of independent discs (RAID). In a RAID device, a RAID controller adds parity data to the original data before storing it across the array. The parity data is calculated from the original data such that the failure of a disc will not result in the loss of the original data. For example, RAID 5 uses three discs to protect data from the failure of a single disc. The parity data, and associated redundancy overhead data, reduces the storage capacity of three independent discs by one third (e.g., n−1=capacity). RAID 6 can recover from a loss of two discs and requires a minimum of four discs with a storage capacity of n−2.

While RAID addresses the memory device failure issue, it is not without its own failure issues that affect its effectiveness, efficiency and security. For instance, as more discs are added to the array, the probability of a disc failure increases, which increases the demand for maintenance. For example, when a disc fails, it needs to be manually replaced before another disc fails and the data stored in the RAID device is lost. To reduce the risk of data loss, data on a RAID device is typically copied on to one or more other RAID devices. While this addresses the loss of data issue, it raises a security issue since multiple copies of data are available, which increases the chances of unauthorized access. Further, as the amount of data being stored grows, the overhead of RAID devices becomes a non-trivial efficiency issue.

BRIEF DESCRIPTION OF THE SEVERAL VIEWS OF THE DRAWING(S)

FIG. 4 is a schematic block diagram of an embodiment of a grid module in accordance with the invention;

FIG. 5 is a diagram of an example embodiment of error coded data slice creation in accordance with the invention;

DETAILED DESCRIPTION OF THE INVENTION

Figure 1:
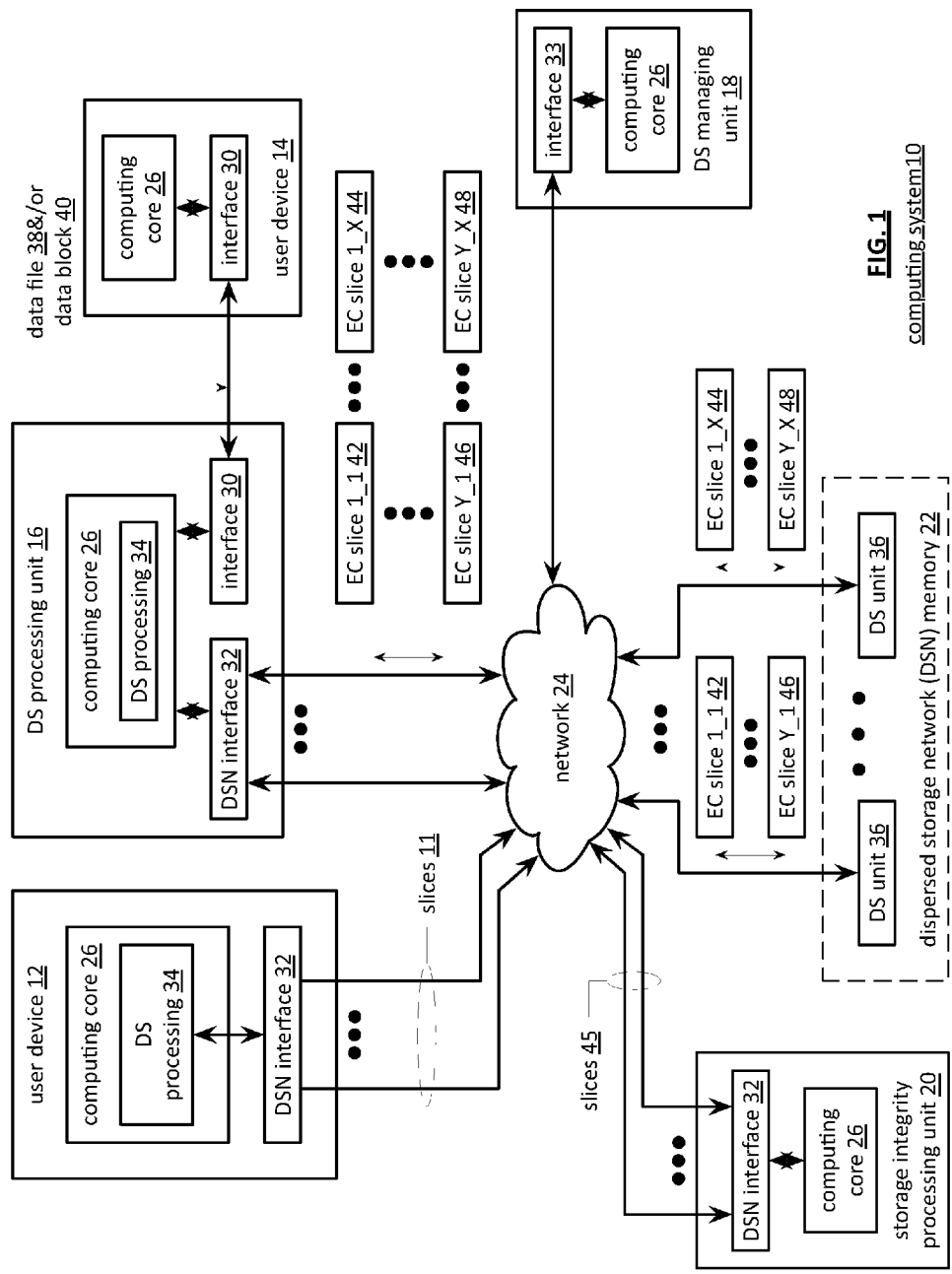
FIG. 1 is a schematic block diagram of an embodiment of a computing system in accordance with the invention.

FIG. 1 is a schematic block diagram of a computing system 10 that includes one or more of a first type of user devices 12, one or more of a second type of user devices 14, at least one distributed storage (DS) processing unit 16, at least one DS managing unit 18, at least one storage integrity processing unit 20, and a distributed storage network (DSN) memory 22 coupled via a network 24. The network 24 may include one or more wireless and/or wire lined communication systems; one or more private intranet systems and/or public internet systems; and/or one or more local area networks (LAN) and/or wide area networks (WAN).

The DSN memory 22 includes a plurality of distributed storage (DS) units 36 for storing data of the system. Each of the DS units 36 includes a processing module and memory and may be located at a geographically different site than the other DS units (e.g., one in Chicago, one in Milwaukee, etc.). The processing module may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that if the processing module includes more than one processing device, the processing devices may be centrally located (e.g., directly coupled together via a wired and/or wireless bus structure) or may be distributedly located (e.g., cloud computing via indirect coupling via a local area network and/or a wide area network). Further note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element stores, and the processing module executes, hard coded and/or operational instructions corresponding to at least some of the steps and/or functions illustrated in FIGS. 1-13.

Each of the user devices 12-14, the DS processing unit 16, the DS managing unit 18, and the storage integrity processing unit 20 may be a portable computing device (e.g., a social networking device, a gaming device, a cell phone, a smart phone, a personal digital assistant, a digital music player, a digital video player, a laptop computer, a handheld computer, a video game controller, and/or any other portable device that includes a computing core) and/or a fixed computing device (e.g., a personal computer, a computer server, a cable set-top box, a satellite receiver, a television set, a printer, a fax machine, home entertainment equipment, a video game console, and/or any type of home or office computing equipment). Such a portable or fixed computing device includes a computing core 26 and one or more interfaces 30, 32, and/or 33. An embodiment of the computing core 26 will be described with reference to FIG. 2.

With respect to the interfaces, each of the interfaces 30, 32, and 33 includes software and/or hardware to support one or more communication links via the network 24 and/or directly. For example, interfaces 30 support a communication link (wired, wireless, direct, via a LAN, via the network 24, etc.) between the first type of user device 12 and the DS processing unit 16. As another example, DSN interface 32 supports a plurality of communication links via the network 24 between the DSN memory 22 and the DS processing unit 16, the first type of user device 12, and/or the storage integrity processing unit 20. As yet another example, interface 33 supports a communication link between the DS managing unit 18 and any one of the other devices and/or units 12, 14, 16, 20, and/or 22 via the network 24.

In general and with respect to data storage, the system 10 supports three primary functions: distributed network data storage management, distributed data storage and retrieval, and data storage integrity verification. In accordance with these three primary functions, data can be distributedly stored in a plurality of physically different locations and subsequently retrieved in a reliable and secure manner regardless of failures of individual storage devices, failures of network equipment, the duration of storage, the amount of data being stored, attempts at hacking the data, etc.

The DS managing unit 18 performs distributed network data storage management functions, which include establishing distributed data storage parameters, performing network operations, performing network administration, and/or performing network maintenance. The DS managing unit 18 establishes the distributed data storage parameters (e.g., allocation of virtual DSN memory space, distributed storage parameters, security parameters, billing information, user profile information, etc.) for one or more of the user devices 12-14 (e.g., established for individual devices, established for a user group of devices, established for public access by the user devices, etc.). For example, the DS managing unit 18 coordinates the creation of a vault (e.g., a virtual memory block) within the DSN memory 22 for a user device (for a group of devices, or for public access). The DS managing unit 18 also determines the distributed data storage parameters for the vault. In particular, the DS managing unit 18 determines a number of slices (e.g., the number that a data segment of a data file and/or data block is partitioned into for distributed storage) and a read threshold value (e.g., the minimum number of slices required to reconstruct the data segment).

As another example, the DS managing module 18 creates and stores, locally or within the DSN memory 22, user profile information. The user profile information includes one or more of authentication information, permissions, and/or the security parameters. The security parameters may include one or more of encryption/decryption scheme, one or more encryption keys, key generation scheme, and data encoding/decoding scheme.

As yet another example, the DS managing unit 18 creates billing information for a particular user, user group, vault access, public vault access, etc. For instance, the DS managing unit 18 tracks the number of times a user accesses a private vault and/or public vaults, which can be used to generate a per-access bill. In another instance, the DS managing unit 18 tracks the amount of data stored and/or retrieved by a user device and/or a user group, which can be used to generate a per-data-amount bill.

The DS managing unit 18 also performs network operations, network administration, and/or network maintenance. As at least part of performing the network operations and/or administration, the DS managing unit 18 monitors performance of the devices and/or units of the system 10 for potential failures, determines the devices' and/or units' activation status, determines the devices' and/or units' loading, and any other system level operation that affects the performance level of the system 10. For example, the DS managing unit 18 receives and aggregates network management alarms, alerts, errors, status information, performance information, and messages from the devices 12-14 and/or the units 16, 20, 22. For example, the DS managing unit 18 receives a simple network management protocol (SNMP) message regarding the status of the DS processing unit 16.

The DS managing unit 18 performs the network maintenance by identifying equipment within the system 10 that needs replacing, upgrading, repairing, and/or expanding. For example, the DS managing unit 18 determines that the DSN memory 22 needs more DS units 36 or that one or more of the DS units 36 needs updating.

The second primary function (i.e., distributed data storage and retrieval) begins and ends with a user device 12-14. For instance, if a second type of user device 14 has a data file 38 and/or data block 40 to store in the DSN memory 22, it sends the data file 38 and/or data block 40 to the DS processing unit 16 via its interface 30. As will be described in greater detail with reference to FIG. 2, the interface 30 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). In addition, the interface 30 may attach a user identification code (ID) to the data file 38 and/or data block 40.

The DS processing unit 16 receives the data file 38 and/or data block 40 via its interface 30 and performs a distributed storage (DS) process 34 thereon (e.g., an error coding dispersal storage function). The DS processing 34 begins by partitioning the data file 38 and/or data block 40 into one or more data segments, which is represented as Y data segments. For example, the DS processing 34 may partition the data file 38 and/or data block 40 into a fixed byte size segment (e.g., $2^1$ to $2^n$ bytes, where n=>2) or a variable byte size (e.g., change byte size from segment to segment, or from groups of segments to groups of segments, etc.).

For each of the Y data segments, the DS processing 34 error encodes (e.g., forward error correction (FEC), information dispersal algorithm, or error correction coding) and slices (or slices then error encodes) the data segment into a plurality of error coded (EC) data slices 42-48, which is represented as X slices per data segment. The number of slices (X) per segment, which corresponds to a number of pillars n, is set in accordance with the distributed data storage parameters and the error coding scheme. For example, if a Reed-Solomon (or other FEC scheme) is used in an n/k system, then a data segment is divided into n slices, where k number of slices is needed to reconstruct the original data (i.e., k is the threshold). As a few specific examples, the n/k factor may be 5/3; 6/4; 8/6; 8/5; 16/10.

For each EC slice 42-48, the DS processing unit 16 creates a unique slice name and appends it to the corresponding EC slice 42-48. The slice name includes universal DSN memory addressing routing information (e.g., virtual memory addresses in the DSN memory 22) and user-specific information (e.g., user ID, file name, data block identifier, etc.).

The DS processing unit 16 transmits the plurality of EC slices 42-48 to a plurality of DS units 36 of the DSN memory 22 via the DSN interface 32 and the network 24. The DSN interface 32 formats each of the slices for transmission via the network 24. For example, the DSN interface 32 may utilize an internet protocol (e.g., TCP/IP, etc.) to packetize the EC slices 42-48 for transmission via the network 24.

The number of DS units 36 receiving the EC slices 42-48 is dependent on the distributed data storage parameters established by the DS managing unit 18. For example, the DS managing unit 18 may indicate that each slice is to be stored in a different DS unit 36. As another example, the DS managing unit 18 may indicate that like slice numbers of different data segments are to be stored in the same DS unit 36. For example, the first slice of each of the data segments is to be stored in a first DS unit 36, the second slice of each of the data segments is to be stored in a second DS unit 36, etc. In this manner, the data is encoded and distributedly stored at physically diverse locations to improve data storage integrity and security. Further examples of encoding the data segments will be provided with reference to one or more of FIGS. 2-13.

Each DS unit 36 that receives an EC slice 42-48 for storage translates the virtual DSN memory address of the slice into a local physical address for storage. Accordingly, each DS unit 36 maintains a virtual to physical memory mapping to assist in the storage and retrieval of data.

The first type of user device 12 performs a similar function to store data in the DSN memory 22 with the exception that it includes the DS processing. As such, the device 12 encodes and slices the data file and/or data block it has to store. The device then transmits the slices 11 to the DSN memory via its DSN interface 32 and the network 24.

For a second type of user device 14 to retrieve a data file or data block from memory, it issues a read command via its interface 30 to the DS processing unit 16. The DS processing unit 16 performs the DS processing 34 to identify the DS units 36 storing the slices of the data file and/or data block based on the read command. The DS processing unit 16 may also communicate with the DS managing unit 18 to verify that the user device 14 is authorized to access the requested data.

Assuming that the user device is authorized to access the requested data, the DS processing unit 16 issues slice read commands to at least a threshold number of the DS units 36 storing the requested data (e.g., to at least 10 DS units for a 16/10 error coding scheme). Each of the DS units 36 receiving the slice read command, verifies the command, accesses its virtual to physical memory mapping, retrieves the requested slice, or slices, and transmits it to the DS processing unit 16.

Once the DS processing unit 16 has received a read threshold number of slices for a data segment, it performs an error decoding function and de-slicing to reconstruct the data segment. When Y number of data segments has been reconstructed, the DS processing unit 16 provides the data file 38 and/or data block 40 to the user device 14. Note that the first type of user device 12 performs a similar process to retrieve a data file and/or data block.

The storage integrity processing unit 20 performs the third primary function of data storage integrity verification. In general, the storage integrity processing unit 20 periodically retrieves slices 45, and/or slice names, of a data file or data block of a user device to verify that one or more slices have not been corrupted or lost (e.g., the DS unit failed). The retrieval process mimics the read process previously described.

If the storage integrity processing unit 20 determines that one or more slices is corrupted or lost, it rebuilds the corrupted or lost slice(s) in accordance with the error coding scheme. The storage integrity processing unit 20 stores the rebuild slice, or slices, in the appropriate DS unit(s) 36 in a manner that mimics the write process previously described.

Figure 2:
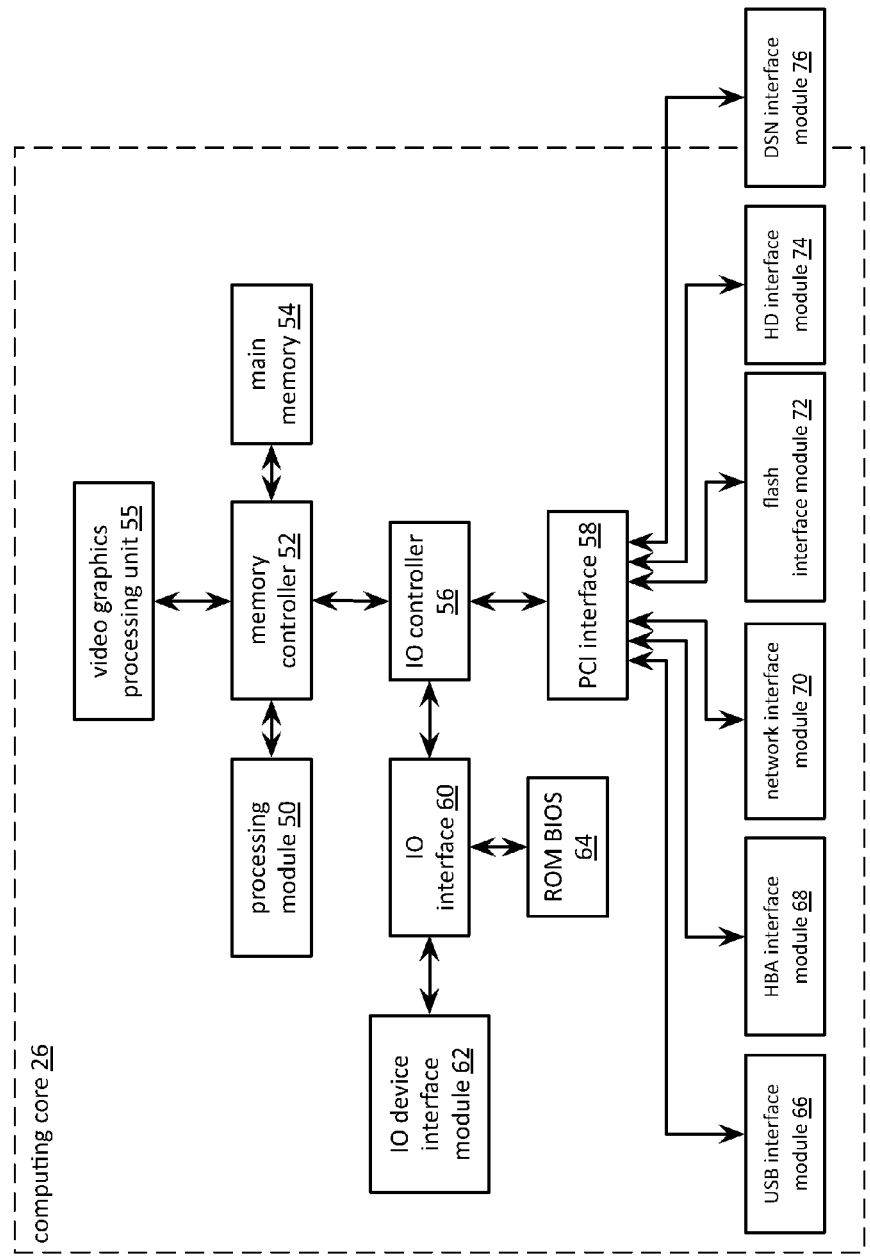
FIG. 2 is a schematic block diagram of an embodiment of a computing core in accordance with the invention.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface 60, at least one IO device interface module 62, a read only memory (ROM) basic input output system (BIOS) 64, and one or more memory interface modules. The memory interface module(s) includes one or more of a universal serial bus (USB) interface module 66, a host bus adapter (HBA) interface module 68, a network interface module 70, a flash interface module 72, a hard drive interface module 74, and a DSN interface module 76. Note the DSN interface module 76 and/or the network interface module 70 may function as the interface 30 of the user device 14 of FIG. 1. Further note that the IO device interface module 62 and/or the memory interface modules may be collectively or individually referred to as IO ports.

The processing module 50 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module 50 may have an associated memory and/or memory element, which may be a single memory device, a plurality of memory devices, and/or embedded circuitry of the processing module 50. Such a memory device may be a read-only memory, random access memory, volatile memory, non-volatile memory, static memory, dynamic memory, flash memory, cache memory, and/or any device that stores digital information. Note that if the processing module 50 includes more than one processing device, the processing devices may be centrally located (e.g., directly coupled together via a wired and/or wireless bus structure) or may be distributedly located (e.g., cloud computing via indirect coupling via a local area network and/or a wide area network). Further note that when the processing module 50 implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element stores, and the processing module 50 executes, hard coded and/or operational instructions corresponding to at least some of the steps and/or functions illustrated in FIGS. 1-13.

Figure 3:
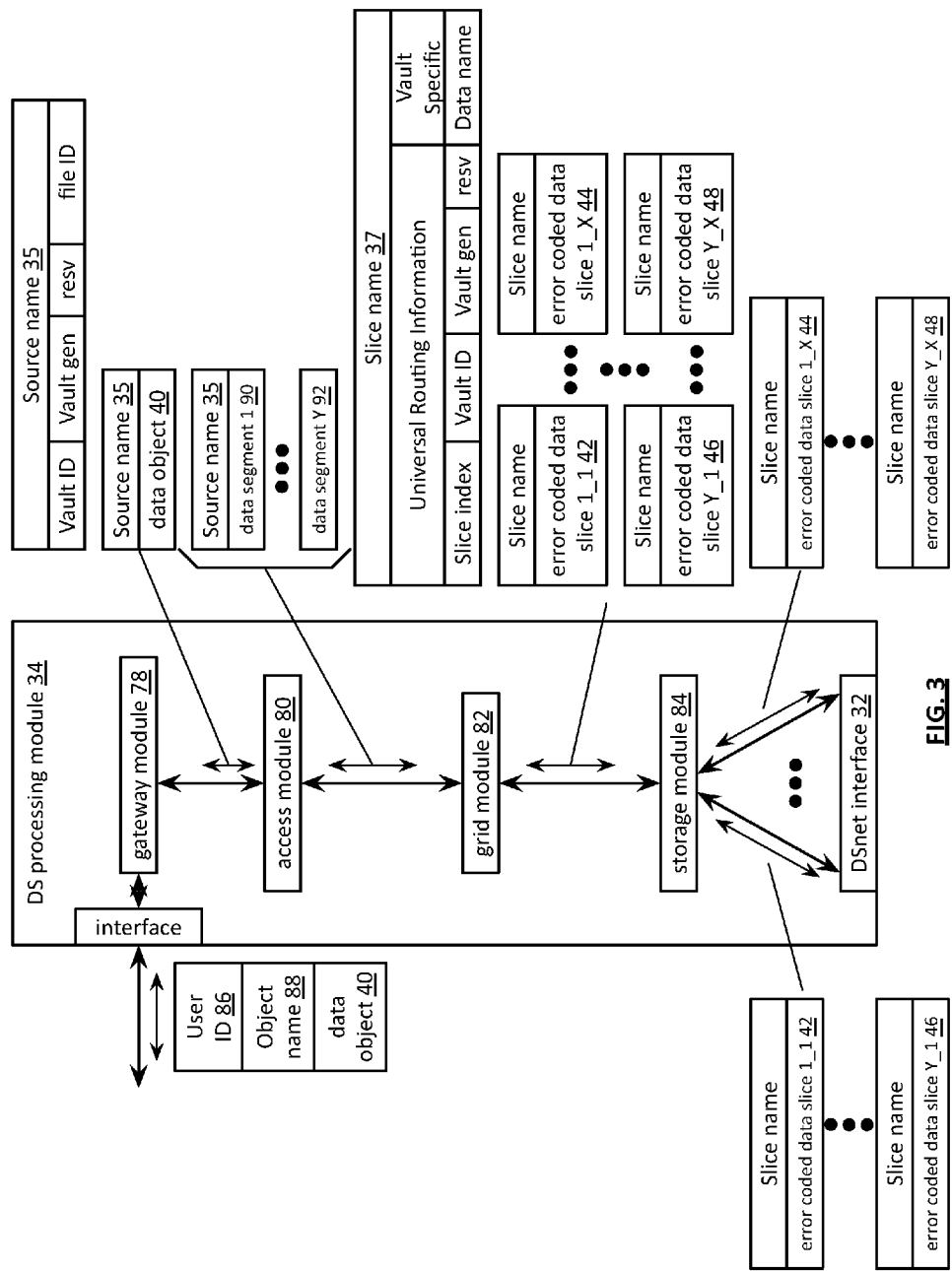
FIG. 3 is a schematic block diagram of an embodiment of a distributed storage processing unit in accordance with the invention.

FIG. 3 is a schematic block diagram of an embodiment of a dispersed storage (DS) processing module 34 of user device 12 and/or of the DS processing unit 16. The DS processing module 34 includes a gateway module 78, an access module 80, a grid module 82, and a storage module 84. The DS processing module 34 may also include an interface 30 and the DSnet interface 32 or the interfaces 68 and/or 70 may be part of user device 12 or of the DS processing unit 16. The DS processing module 34 may further include a bypass/feedback path between the storage module 84 to the gateway module 78. Note that the modules 78-84 of the DS processing module 34 may be in a single unit or distributed across multiple units.

In an example of storing data, the gateway module 78 receives an incoming data object that includes a user ID field 86, an object name field 88, and the data object field 40 and may also receive corresponding information that includes a process identifier (e.g., an internal process/application ID), metadata, a file system directory, a block number, a transaction message, a user device identity (ID), a data object identifier, a source name, and/or user information. The gateway module 78 authenticates the user associated with the data object by verifying the user ID 86 with the DS managing unit 18 and/or another authenticating unit.

When the user is authenticated, the gateway module 78 obtains user information from the management unit 18, the user device, and/or the other authenticating unit. The user information includes a vault identifier, operational parameters, and user attributes (e.g., user data, billing information, etc.). A vault identifier identifies a vault, which is a virtual memory space that maps to a set of DS storage units 36. For example, vault 1 (i.e., user 1's DSN memory space) includes eight DS storage units (X=8 wide) and vault 2 (i.e., user 2's DSN memory space) includes sixteen DS storage units (X=16 wide). The operational parameters may include an error coding algorithm, the width n (number of pillars X or slices per segment for this vault), a read threshold T, a write threshold, an encryption algorithm, a slicing parameter, a compression algorithm, an integrity check method, caching settings, parallelism settings, and/or other parameters that may be used to access the DSN memory layer.

The gateway module 78 uses the user information to assign a source name 35 to the data. For instance, the gateway module 78 determines the source name 35 of the data object 40 based on the vault identifier and the data object. For example, the source name may contain a file identifier (ID), a vault generation number, a reserved field, and a vault identifier (ID). As another example, the gateway module 78 may generate the file ID based on a hash function of the data object 40. Note that the gateway module 78 may also perform message conversion, protocol conversion, electrical conversion, optical conversion, access control, user identification, user information retrieval, traffic monitoring, statistics generation, configuration, management, and/or source name determination.

The access module 80 receives the data object 40 and creates a series of data segments 1 through Y 90-92 in accordance with a data storage protocol (e.g., file storage system, a block storage system, and/or an aggregated block storage system). The number of segments Y may be chosen or randomly assigned based on a selected segment size and the size of the data object. For example, if the number of segments is chosen to be a fixed number, then the size of the segments varies as a function of the size of the data object. For instance, if the data object is an image file 4,194,304 eight bit bytes (e.g., 33,554,432 bits) and the number of segments Y=131,072, then each segment is 256 bits or 32 bytes. As another example, if segment size is fixed, then the number of segments Y varies based on the size of data object. For instance, if the data object is an image file of 4,194,304 bytes and the fixed size of each segment is 4,096 bytes, then the number of segments Y=1,024. Note that each segment is associated with the same source name.

The grid module 82 receives the data segments and may manipulate (e.g., compression, encryption, cyclic redundancy check (CRC), etc.) each of the data segments before performing an error coding function of the error coding dispersal storage function to produce a pre-manipulated data segment. After manipulating a data segment, if applicable, the grid module 82 error encodes (e.g., Reed-Solomon, Convolution encoding, Trellis encoding, etc.) the data segment or manipulated data segment into X error coded data slices 42-44.

The value X, or the number of pillars (e.g., X=16), is chosen as a parameter of the error coding dispersal storage function. Other parameters of the error coding dispersal function include a read threshold T, a write threshold W, etc. The read threshold (e.g., T=10, when X=16) corresponds to the minimum number of error-free error coded data slices required to reconstruct the data segment. In other words, the DS processing module 34 can compensate for X−T (e.g., 16−10=6) missing error coded data slices per data segment. The write threshold W corresponds to a minimum number of DS storage units that acknowledge proper storage of their respective data slices before the DS processing module indicates proper storage of the encoded data segment. Note that the write threshold is greater than or equal to the read threshold for a given number of pillars (X).

For each data slice of a data segment, the grid module 82 generates a unique slice name 37 and attaches it thereto. The slice name 37 includes a universal routing information field and a vault specific field and may be 48 bytes (e.g., 24 bytes for each of the universal routing information field and the vault specific field). As illustrated, the universal routing information field includes a slice index, a vault ID, a vault generation, and a reserved field. The slice index is based on the pillar number and the vault ID and, as such, is unique for each pillar (e.g., slices of the same pillar for the same vault for any segment will share the same slice index). The vault specific field includes a data name, which includes a file ID and a segment number (e.g., a sequential numbering of data segments 1-Y of a simple data object or a data block number).

Prior to outputting the error coded data slices of a data segment, the grid module may perform post-slice manipulation on the slices. If enabled, the manipulation includes slice level compression, encryption, CRC, addressing, tagging, and/or other manipulation to improve the effectiveness of the computing system.

When the error coded data slices of a data segment are ready to be outputted, the grid module 82 determines which of the DS storage units 36 will store the EC data slices based on a dispersed storage memory mapping associated with the user's vault and/or DS storage unit attributes. The DS storage unit attributes may include availability, self-selection, performance history, link speed, link latency, ownership, available DSN memory, domain, cost, a prioritization scheme, a centralized selection message from another source, a lookup table, data ownership, and/or any other factor to optimize the operation of the computing system. Note that the number of DS storage units 36 is equal to or greater than the number of pillars (e.g., X) so that no more than one error coded data slice of the same data segment is stored on the same DS storage unit 36. Further note that EC data slices of the same pillar number but of different segments (e.g., EC data slice 1 of data segment 1 and EC data slice 1 of data segment 2) may be stored on the same or different DS storage units 36.

The storage module 84 performs an integrity check on the outbound encoded data slices and, when successful, identifies a plurality of DS storage units based on information provided by the grid module 82. The storage module 84 then outputs the encoded data slices 1 through X of each segment 1 through Y to the DS storage units 36. Each of the DS storage units 36 stores its EC data slice(s) and maintains a local virtual DSN address to physical location table to convert the virtual DSN address of the EC data slice(s) into physical storage addresses.

In an example of a read operation, the user device 12 and/or 14 sends a read request to the DS processing unit 16, which authenticates the request. When the request is authentic, the DS processing unit 16 sends a read message to each of the DS storage units 36 storing slices of the data object being read. The slices are received via the DSnet interface 32 and processed by the storage module 84, which performs a parity check and provides the slices to the grid module 82 when the parity check was successful. The grid module 82 decodes the slices in accordance with the error coding dispersal storage function to reconstruct the data segment. The access module 80 reconstructs the data object from the data segments and the gateway module 78 formats the data object for transmission to the user device.

FIG. 4 is a schematic block diagram of an embodiment of a grid module 82 that includes a control unit 73, a pre-slice manipulator 75, an encoder 77, a slicer 79, a post-slice manipulator 81, a pre-slice de-manipulator 83, a decoder 85, a de-slicer 87, and/or a post-slice de-manipulator 89. Note that the control unit 73 may be partially or completely external to the grid module 82. For example, the control unit 73 may be part of the computing core at a remote location, part of a user device, part of the DS managing unit 18, or distributed amongst one or more DS storage units.

In an example of write operation, the pre-slice manipulator 75 receives a data segment 90-92 and a write instruction from an authorized user device. The pre-slice manipulator 75 determines if pre-manipulation of the data segment 90-92 is required and, if so, what type. The pre-slice manipulator 75 may make the determination independently or based on instructions from the control unit 73, where the determination is based on a computing system-wide predetermination, a table lookup, vault parameters associated with the user identification, the type of data, security requirements, available DSN memory, performance requirements, and/or other metadata.

Once a positive determination is made, the pre-slice manipulator 75 manipulates the data segment 90-92 in accordance with the type of manipulation. For example, the type of manipulation may be compression (e.g., Lempel-Ziv-Welch, Huffman, Golomb, fractal, wavelet, etc.), signatures (e.g., Digital Signature Algorithm (DSA), Elliptic Curve DSA, Secure Hash Algorithm, etc.), watermarking, tagging, encryption (e.g., Data Encryption Standard, Advanced Encryption Standard, etc.), adding metadata (e.g., time/date stamping, user information, file type, etc.), cyclic redundancy check (e.g., CRC32), and/or other data manipulations to produce the pre-manipulated data segment.

The encoder 77 encodes the pre-manipulated data segment 92 using a forward error correction (FEC) encoder (and/or other type of erasure coding and/or error coding) to produce an encoded data segment 94. The encoder 77 determines which forward error correction algorithm to use based on a predetermination associated with the user's vault, a time based algorithm, user direction, DS managing unit direction, control unit direction, as a function of the data type, as a function of the data segment 92 metadata, and/or any other factor to determine algorithm type. The forward error correction algorithm may be Golay, Multidimensional parity, Reed-Solomon, Hamming, Bose Ray Chauduri Hocquenghem (BCH), Cauchy-Reed-Solomon, or any other FEC encoder. Note that the encoder 77 may use a different encoding algorithm for each data segment 92, the same encoding algorithm for the data segments 92 of a data object, or a combination thereof.

The encoded data segment 94 is of greater size than the data segment 92 by the overhead rate of the encoding algorithm by a factor of X/T, where X is the width or number of slices, and T is the read threshold. In this regard, the corresponding decoding process can accommodate at most X−T missing EC data slices and still recreate the data segment 92. For example, if X=16 and T=10, then the data segment 92 will be recoverable as long as 10 or more EC data slices per segment are not corrupted.

The slicer 79 transforms the encoded data segment 94 into EC data slices in accordance with the slicing parameter from the vault for this user and/or data segment 92. For example, if the slicing parameter is X=16, then the slicer 79 slices each encoded data segment 94 into 16 encoded slices.

The post-slice manipulator 81 performs, if enabled, post-manipulation on the encoded slices to produce the EC data slices. If enabled, the post-slice manipulator 81 determines the type of post-manipulation, which may be based on a computing system-wide predetermination, parameters in the vault for this user, a table lookup, the user identification, the type of data, security requirements, available DSN memory, performance requirements, control unit directed, and/or other metadata. Note that the type of post-slice manipulation may include slice level compression, signatures, encryption, CRC, addressing, watermarking, tagging, adding metadata, and/or other manipulation to improve the effectiveness of the computing system.

In an example of a read operation, the post-slice de-manipulator 89 receives at least a read threshold number of EC data slices and performs the inverse function of the post-slice manipulator 81 to produce a plurality of encoded slices. The de-slicer 87 de-slices the encoded slices to produce an encoded data segment 94. The decoder 85 performs the inverse function of the encoder 77 to recapture the data segment 90-92. The pre-slice de-manipulator 83 performs the inverse function of the pre-slice manipulator 75 to recapture the data segment 90-92.

FIG. 5 is a diagram of an example of slicing an encoded data segment 94 by the slicer 79. In this example, the encoded data segment 94 includes thirty-two bits, but may include more or less bits. The slicer 79 disperses the bits of the encoded data segment 94 across the EC data slices in a pattern as shown. As such, each EC data slice does not include consecutive bits of the data segment 94 reducing the impact of consecutive bit failures on data recovery. For example, if EC data slice 2 (which includes bits 1, 5, 9, 13, 17, 25, and 29) is unavailable (e.g., lost, inaccessible, or corrupted), the data segment can be reconstructed from the other EC data slices (e.g., 1, 3 and 4 for a read threshold of 3 and a width of 4).

Figure 6:
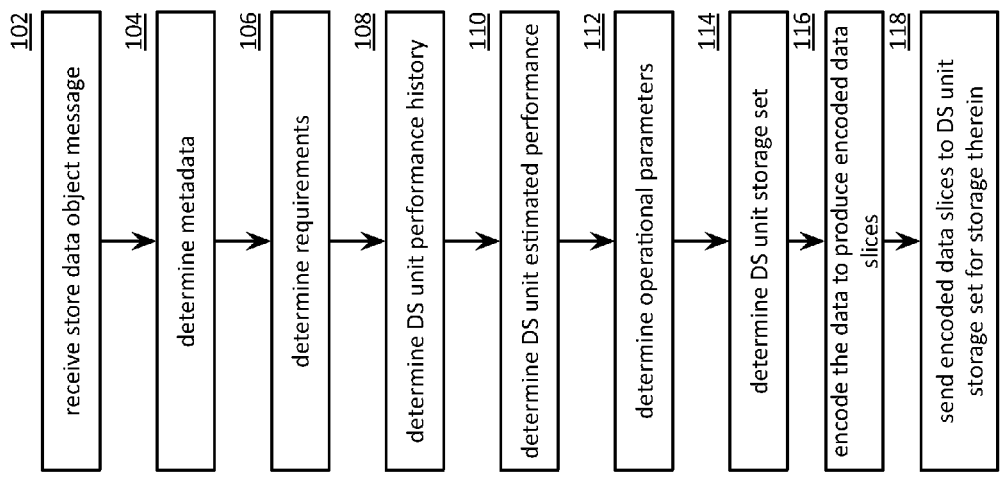
FIG. 6 is a flowchart illustrating an example of storing data as encoded data slices in accordance with invention.

FIG. 6 is a flowchart illustrating an example of storing data as encoded data slices. The method begins with step 102 were a processing module receives a store data object message from one or more of a user device, a storage integrity processing unit, a dispersed storage (DS) processing unit, a DS managing unit, and a DS unit. The store data object message includes one or more of a data object name, a data object size, a data type, a data object, an input metadata, a priority indicator, a security indicator, a performance indicator, a user device identifier (ID), and input requirements.

The method continues at step 104 where the processing module determines metadata regarding data of the data object. Such metadata summarizes attributes of the data object including identification of priority data, identification of non-priority data, a data type, a data size indicator, and storage requirements. Such a determination may be based on one or more of a vault lookup, a command, a message, a predetermination, a data object analysis, the data object name, the data object size, a data type, the data object, the input metadata, the priority indicator, the security indicator, the performance indicator, the input requirements, and retrieval of a metadata file that is linked to a data object indicating previous metadata.

The method continues at step 106 where the processing module determines requirements associated with storing the data object including one or more of expected access frequency, priority, security, performance, access latency, and reliability. Such a determination may be based on one or more of the metadata, a metadata analysis, a vault lookup, a command, a message, a predetermination, a data object analysis, the data object name, the data object size, a data type, the data object, the input metadata, the priority indicator, the security indicator, the performance indicator, and the input requirements. For example, the processing module determines that the access latency requirement is slower than average and the reliability requirement is higher than average when the performance indicator indicates that more reliability is favored over faster access latency.

The method continues at step 108 where the processing module determines DS unit performance history with regards to DS units of a dispersed storage network (DSN) memory. Such DS unit performance history includes one or more of history of reliability, availability, access latency, bandwidth utilization, security performance, and cost. Such a determination may be based on one or more of a vault lookup, a command, a message, a predetermination, and DS unit query. The processing module determines the DS unit performance history for a plurality of DS units where the plurality of DS units are candidates to be included in a DS unit storage set.

The method continues at step 110 where the processing module determines DS unit estimated performance. Such DS unit estimated performance includes one or more of a performance based indication regarding storage of a data segment as a set of encoded data slices, an estimation of reliability, estimated availability, estimated access latency, estimated bandwidth utilization, estimated security performance, estimated cost, and estimated availability. Such a determination may be based on one or more of a vault lookup, a command, a message, a predetermination, a DS unit query, the DS unit performance history, and an estimation algorithm. For example, the processing module determines that DS unit estimated access latency performance is lower than average when the DS unit access latency performance history was lower than average. As another example, the processing module determines the DS unit estimated reliability to be lower than average when the DS unit reliability history was lower than average. As yet another example, the processing module determines a performance based indication regarding storage of a data segment as a set of encoded data slices as the DS unit estimated performance.

The method continues at step 112 where processing module determines error coding dispersal storage function parameters (e.g., operational parameters). Such parameters may include one or more of a pillar width n, a read threshold, a decode threshold k, a write threshold, an encode/decode algorithm, and an encryption method. Such a determination may be based on one or more of a vault lookup, a command, a message, a predetermination, a DS unit query, the DS unit performance history, the DS unit estimated performance, the requirements, the metadata, and information received in the store data object message. For example, the processing module determines to utilize a relatively large number of DS units in the storage set (e.g., a higher pillar width n) and a lower decode threshold k when the processing module determines that the DS units are less reliable than average and the requirements include higher than average reliability. As another example, the processing module determines to utilize a relatively small number of DS units in the DS unit storage set and a higher decode threshold k when the processing module determines that the DS units are more reliable than average and the requirements include greater efficiency of storage.

The method continues at step 114 where the processing module determines the DS unit storage set based on one or more of an encoded data slice, an associated slice name, a vault lookup, identification of a slice name range to be rebuilt, a second DS unit identifier associated with the DS unit affiliated with the associated slice name, a virtual dispersed storage network (DSN) address to physical location table lookup, a command, a message, a predetermination, a DS unit query, the error coding dispersal storage function parameters, the DS unit performance history, the DS unit estimated performance, the requirements, the metadata, and the information received in the store data object message. Note that the processing module may re-determine the error coding dispersal storage function parameters when DS units that meet the requirements are not available. Alternatively, the processing module may determine the DS unit storage set prior to determining the error coding dispersal storage function parameters.

The method continues at step 116 where the processing module dispersed storage error encodes the data to produce a plurality of sets of encoded data slices in accordance with the error coding dispersal storage function parameters. Next, the processing module appends one or more of the metadata, the requirements, the DS unit performance history, the DS unit estimated performance, a source name, a slice name, and the error coding dispersal storage function parameters to one or more of data segments created from the data object prior to encoding and slicing the data segment to enable subsequent re-creation of the data object. Alternatively, the processing module creates a metadata file that includes one or more of the metadata, the requirements, the DS unit performance history, the DS unit estimated performance, the source name, the slice name, and the error coding dispersal storage function parameters. Next, the processing module stores the metadata file the DSN memory as encoded metadata slices to enable subsequent retrieval and re-creation of the data object. The method at step 118 continues where the processing module sends the plurality of sets of encoded data slices to DS units of the DS unit storage set for storage therein.

Figure 7:
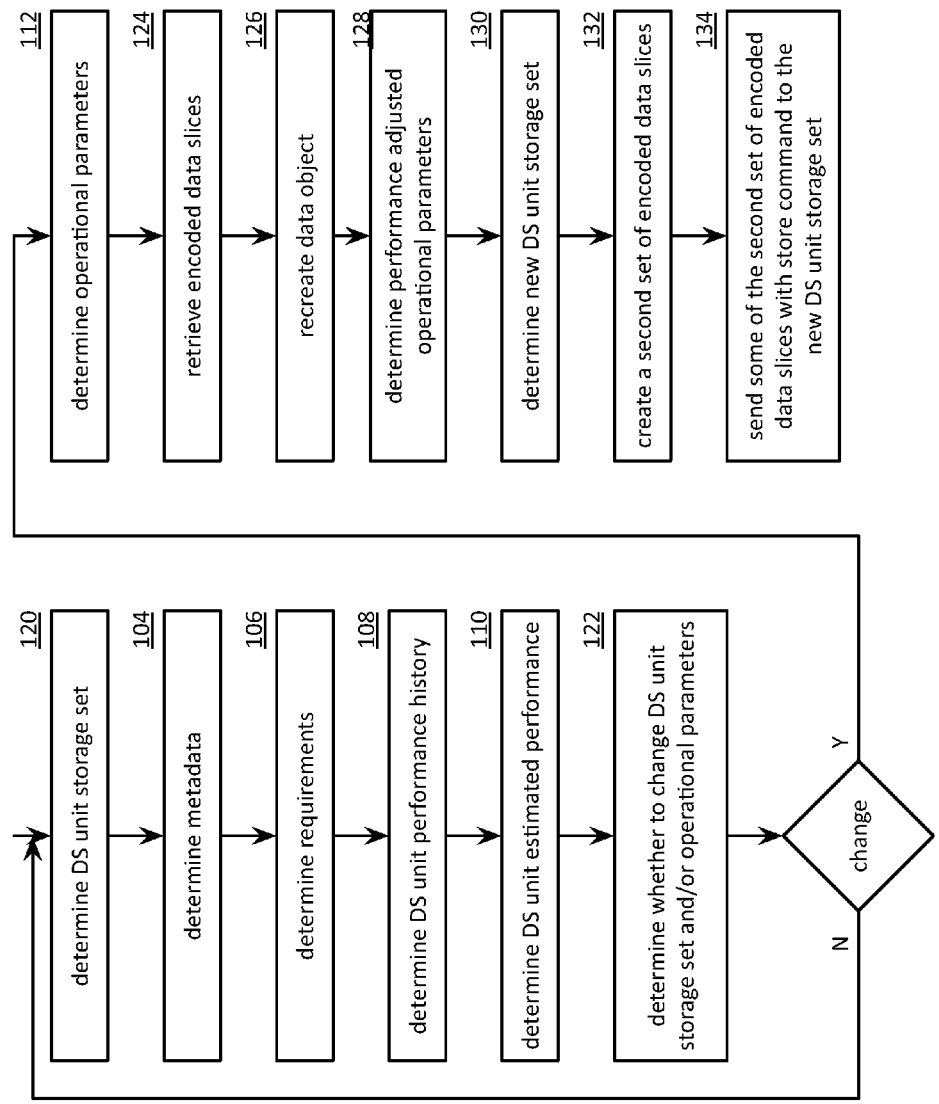
FIG. 7 is a flowchart illustrating an example of re-storing data as encoded data slices in accordance with invention.

FIG. 7 is a flowchart illustrating an example of re-storing data as encoded data slices, which includes some similar steps to FIG. 6. The method begins with step 120 where a processing module determines a dispersed storage (DS) unit storage set based on one or more of a data object name, a user identifier (ID), where a sequence left off last time, a directory entry, a storage location table lookup, a command, a message, a predetermination, and a query. As a specific example, the processing module determines a DS unit storage set 457 based on the storage location table lookup corresponding to a data object foo.txt, wherein foo.txt is a next entry of a directory entry.

The method continues with steps 104-110 of FIG. 6 and then continues with step 122 where the processing module determines whether to change the DS unit storage set and/or to change error coding dispersal storage function parameters (e.g., operational parameters) based on a comparison of the DS unit estimated performance to the requirements. For example, the processing module compares a performance based indication (e.g., the DS unit estimated performance based on the DS unit performance history) with a performance threshold of the requirements. Note that the DS unit estimated performance may have changed since encoded data slices were originally stored to the DS unit storage set. Further note that the requirements may have changed since the slices were originally stored to the DS unit storage set. The processing module determines to change the DS unit storage set and/or the error coding dispersal storage function parameters when the processing module determines that the comparison of the DS unit estimated performance to the requirements is unfavorable.

For example, the processing module determines to change the DS unit storage set when a DS unit estimated reliability level is below a required reliability level. As another example, the processing module determines to change the error coding dispersal storage function parameters when a DS unit estimated access latency time is above a required access latency. As yet another example, the processing module determines to change the DS unit storage set and the error coding dispersal storage function parameters when the DS unit estimated reliability level is below the required reliability level and the DS unit estimated access latency time is above the required access latency.

The method repeats back to step 120 when the processing module determines not to change the DS unit storage set and/or the error coding dispersal storage function parameters (e.g., the performance based indication compares favorably with the performance threshold). The method continues to step 112 of FIG. 6 when the processing module determines to change the DS unit storage set and/or the error coding dispersal storage function parameters (e.g., the performance based indication compares unfavorably with the performance threshold).

The method continues at step 124 where the processing module retrieves a set of encoded data slices from the DS unit storage set by sending a read encoded data slice message to at least a read threshold number of DS units of the DS unit storage set and receiving at least a decode threshold number of encoded data slices of the set of encoded data slices. The method continues at step 126 where the processing module dispersed storage error decodes the at least the decode threshold number of encoded data slices of the set of encoded data slices in accordance with the error coding dispersal storage function parameters to reproduce a data segment as a reproduced data segment.

The method continues at step 128 where the processing module adjusts the error coding dispersal storage function parameters based on the unfavorable comparison of the performance based indication with the performance threshold to produce performance adjusted error coding dispersal storage function parameters. Such adjusting includes one or more of determining desired error coding dispersal storage function parameters based on the performance threshold and the performance based indication, determining a difference between desired error coding dispersal storage function parameters and the error coding dispersal storage function parameters to produce a parameters difference, and adjusting the error coding dispersal storage function parameters based on the parameters difference, wherein determining at least one of the desired error coding dispersal storage function parameters and the parameters difference is based on at least one of a set of DS units, the error coding dispersal storage function parameters, a vault lookup, a command, a message, a predetermination, a DS unit query, a historical DS unit performance level, an estimated DS unit performance level, storage requirements, security requirements, and metadata.

For example, the processing module adjusts the error coding dispersal storage function parameters by increasing a difference between a decode threshold and a pillar width and adjusting an encoding matrix in accordance with the increasing of the difference when the performance based indication compares unfavorably with the performance threshold as a result of under-performance. As another example, the processing module adjusts the error coding dispersal storage function parameters by decreasing a difference between a decode threshold and a pillar width and adjusting an encoding matrix in accordance with the increasing of the difference when the performance based indication compares unfavorably with the performance threshold as a result of over-performance. As yet another example, the processing module adjusts the error coding dispersal storage function parameters to include a different encryption algorithm when the security requirements have changed. Next, the processing module saves the performance adjusted error coding dispersal storage function parameters by storing the performance adjusted error coding dispersal storage function parameters in a local memory and/or as encoded parameters slices in a dispersed storage network (DSN) memory.

The method continues at step 130 where the processing module determines a new DS unit storage set based on one or more of a vault lookup, a command, a message, a predetermination, a DS unit query, the error coding dispersal storage function parameters, the performance adjusted error coding dispersal storage function parameters, the DS unit storage set, the DS unit performance history, the DS unit estimated performance, the requirements, the metadata, and information received in the store data object message. Next, processing module saves the new DS unit storage set selection by storing the new DS unit storage set selection in a local memory and/or as encoded DS unit selection slices in the DSN memory.

The method continues at step 132 where the processing module encodes the reproduced data segment in accordance with the performance adjusted error coding dispersal storage function parameters to produce a second set of encoded data slices. Next, the processing module selects a storage set of encoded data slices from the set of encoded data slices and the second set of encoded data slices based on a difference between the performance adjusted error coding dispersal storage function parameters and the error coding dispersal storage function parameters. Such selecting of the storage set of encoded data slices includes at least one of selecting the set of encoded data slices and selecting at least one encoded data slice of the second set of encoded data slices. Next, processing module updates a storage location table to associate a corresponding slice name of a set of slice names with a corresponding encoded data slice of the storage set of encoded data slices to facilitate subsequent retrieval.

Alternatively, retrieval may be accomplished by a lookup of original locations of original encoded data slices and extend address ranges of the original locations to provide locations of newer encoded data slices associated with the original encoded data slices. Note that the first decode threshold number k of encoded data slices of the second set of encoded data slices specify the reproduced data segment in its original format when an encoding matrix includes a unity sub-matrix. Further note that remaining n-k encoded data slices of the second set of encoded data slices specify parity information that may be utilized in subsequent retrieval process to correct for errors when the first k encoded data slices are not successfully retrieved. Further note that the first set of encoded data slices are included in the second set of encoded data slices when the second set of encoded data slices are produced by encoding the reproduced data segment with an encoding matrix that is identical to the encoding matrix utilized to produce the first set of encoded data slices with the exception that one or more rows are added which result in generation of further parity slices. For example, the processing module produces one new slice (e.g., slice number 17) in the second set of encoded data slices when the error coding dispersal storage function parameters include a pillar width of 16, and a decode threshold of 10, and the performance adjusted error coding dispersal storage function parameters include a pillar width of 17 and a decode threshold of 10. The method continues at step 134 where the processing module outputs each of the encoded data slices of the storage set of encoded data slices that is selected from the second set of encoded data slices to the new DS unit storage set of the DSN memory for storage therein.

Figure 8A:
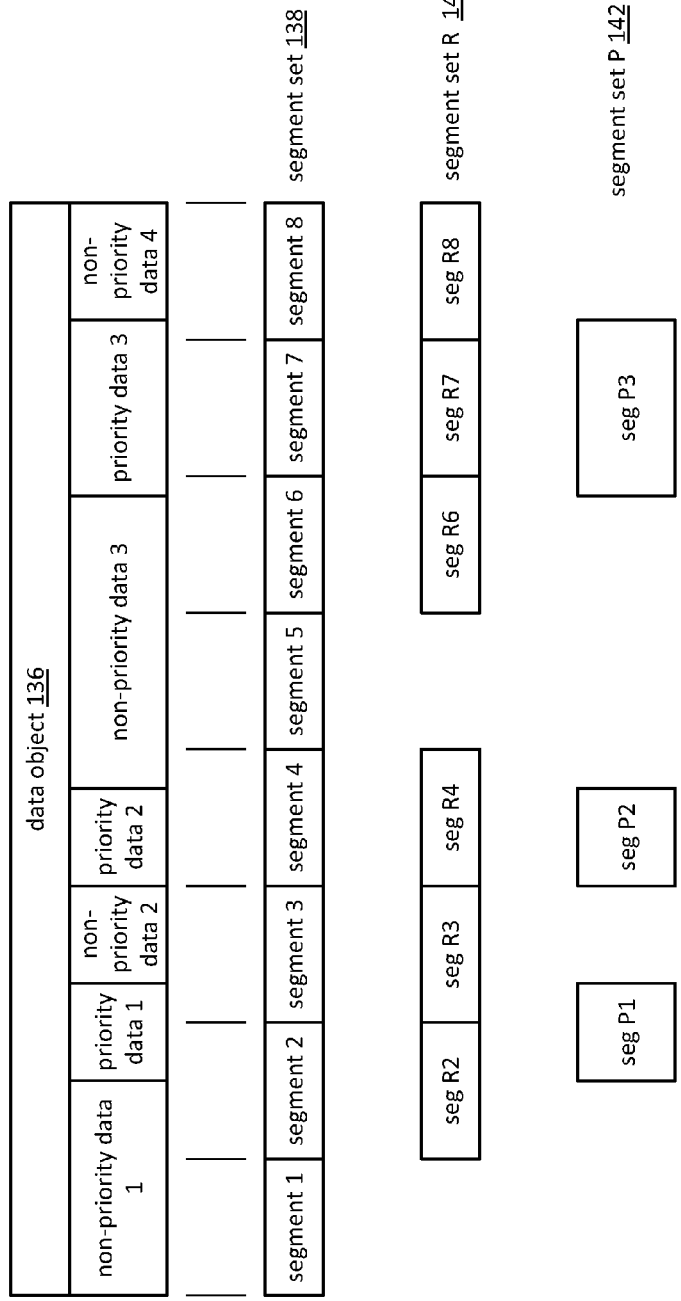
FIG. 8A is a diagram illustrating an example of data segmentation of data in accordance with the invention.

FIG. 8A is a diagram illustrating data segmentation of data that includes a data object 136, a segment set 138, a segment set R 140, and a segment set P 142. The data object 136 includes data wherein the data comprises non-priority data 1-4 and priority data 1-3. Note that priority data may be more important with regards to subsequent utilization of the data object as compared to the non-priority data. In an example, priority data includes header information, codec information, and base frames associated with a compressed video file and non-priority data includes different video frames of the compressed video file.

The data object 136 may be stored in a dispersed storage network (DSN) memory as a plurality of sets of encoded data slices, wherein each set of encoded data slices corresponds to encoding a plurality of data segments of the data object 136. The segment set 138 represents data segments 1-8, wherein each of the data segments are substantially the same size created as a result of segmentation of the data object 136 without regard to non-priority data or priority data. Alternatively, or in addition to, the data object 136 may be stored in the DSN memory as a plurality of sets of priority encoded data slices corresponding to encoding a plurality of priority data segments of the data object 136. The segment set R 140 represents priority data segments 2-4 and 6-8, wherein each of the data segments are substantially the same size as corresponding data segments 2-4, and 6-8 that contain priority data of the plurality of data segments created as a result of segmentation of the data object 136 to capture priority data 1-3. Alternatively, or in addition to, the segment set P 142 represents priority data 1-3, wherein each of the data segments are substantially the same size as corresponding priority data 1-3. A method of storing data segments and priority data segments is discussed in greater detail with reference to FIG. 9. A method of retrieving data segments and priority data segments is discussed in greater detail with reference to FIG. 10.

Note that the storing of the plurality of sets of priority encoded data slices provides a priority data retrieval reliability improvement when the priority data segments are stored in addition to data segments corresponding to priority data. Further note that the storing of the plurality of sets of priority encoded data slices provides a priority data retrieval reliability improvement when the priority data is stored as priority data segments rather than as data segments and when error coding dispersal storage function parameters associated with the encoding of the priority data segments provides more reliable storage as compared to error coding dispersal storage function parameters associated with the encoding of data segments. Such differences in error coding dispersal storage function parameters are discussed in greater detail with reference to FIG. 8B.

Figure 8B:
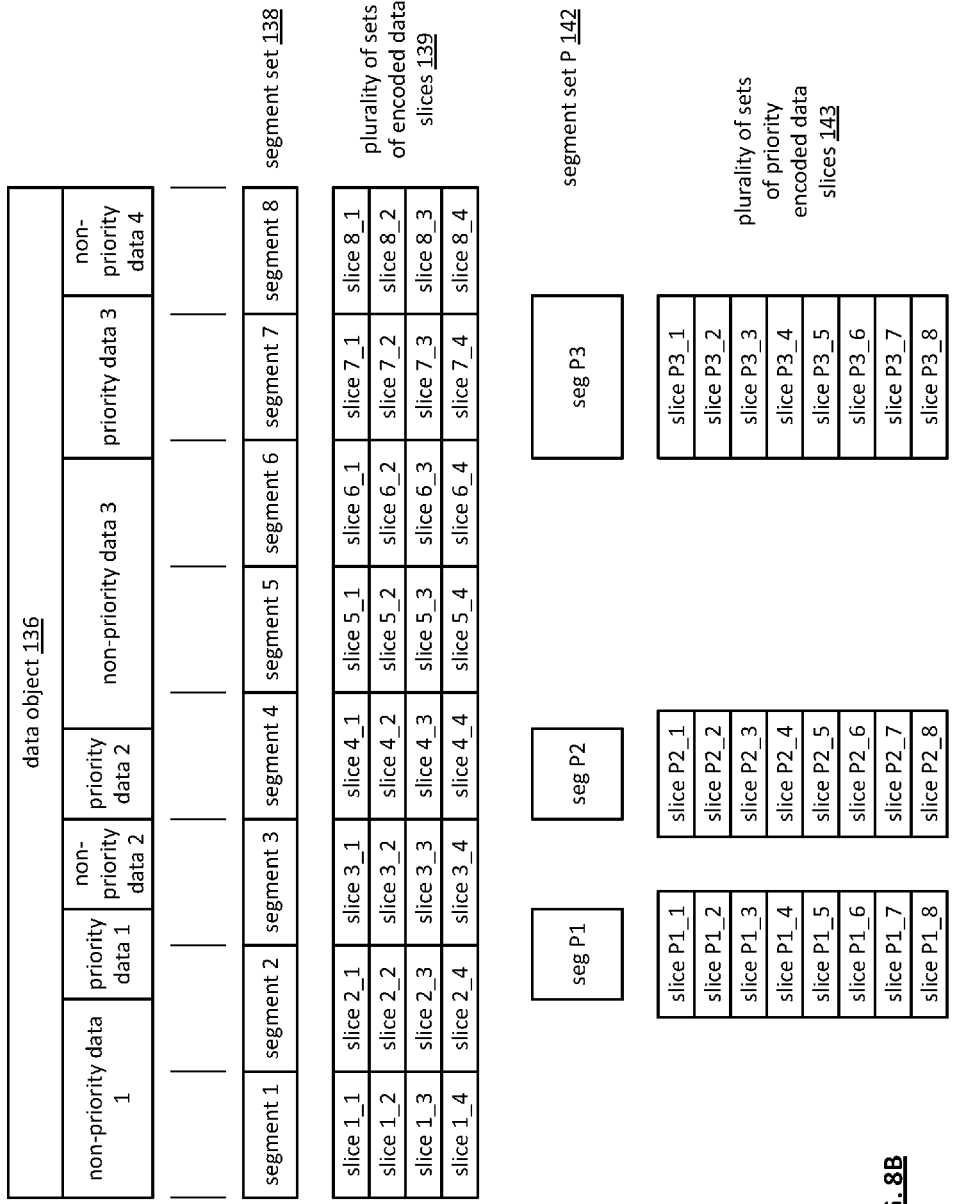
FIG. 8B is a diagram illustrating an example of encoding data segments in accordance with the invention.

FIG. 8B is a diagram illustrating an example of encoding data segments that includes a data object 136, a segment set 138, and a segment set P 142 of FIG. 8A and a plurality of sets of encoded data slices 139 and a plurality of sets of priority encoded data slices 143. Each data segment of the segment set 138 is dispersed storage error encoded in accordance with first error coding dispersal storage function parameters to produce the plurality of sets of encoded data slices 139. For example, data segment 3 is dispersed storage error encoded to produce a set of encoded data slices 3__1-3__4, when a pillar width is 4 of the first error coding dispersal storage function parameters. Each priority data segment of the segment set P 142 is dispersed storage error encoded in accordance with second error coding dispersal storage function parameters to produce the plurality of sets of priority encoded data slices 143. For example, data segment P2 is dispersed storage error encoded to produce a set of encoded data slices P2__1-P2__8, when a pillar width is 8 of the second error coding dispersal storage function parameters.

Note that the first error coding dispersal storage function parameters may be determined such that dispersed storage error encoding data segments containing only non-priority data 1-4 of the segment set 138 to produce encoded data slices of the plurality of sets of encoded data slices 139 in accordance with the first error coding dispersal storage function parameters will result in a desired level of non-priority data retrieval reliability. For example, first error coding dispersal storage function parameters that include a pillar width of 4 and a decode threshold of 3 are selected to provide a desired level of non-priority data retrieval reliability. Note that improved retrieval reliability is provided when a difference between a pillar width and a decode threshold of the second error coding dispersal storage function parameters is greater than a difference between a pillar width and a decode threshold of the first error coding dispersal storage function parameters. The second error coding dispersal storage function parameters may be determined such that dispersed storage error encoding priority data segments containing priority data 1-3 of the segment set P 142 to produce priority encoded data slices of the plurality of sets of priority encoded data slices 143 in accordance with the second error coding dispersal storage function parameters will result in a desired level of priority data retrieval reliability. For example, second error coding dispersal storage function parameters that include a pillar width of 8 and a decode threshold of 5 are selected to provide a higher level of priority data retrieval reliability as compared to utilizing first error coding dispersal storage function parameters when the pillar width is 4 and the decode threshold is 3.

Figure 9:
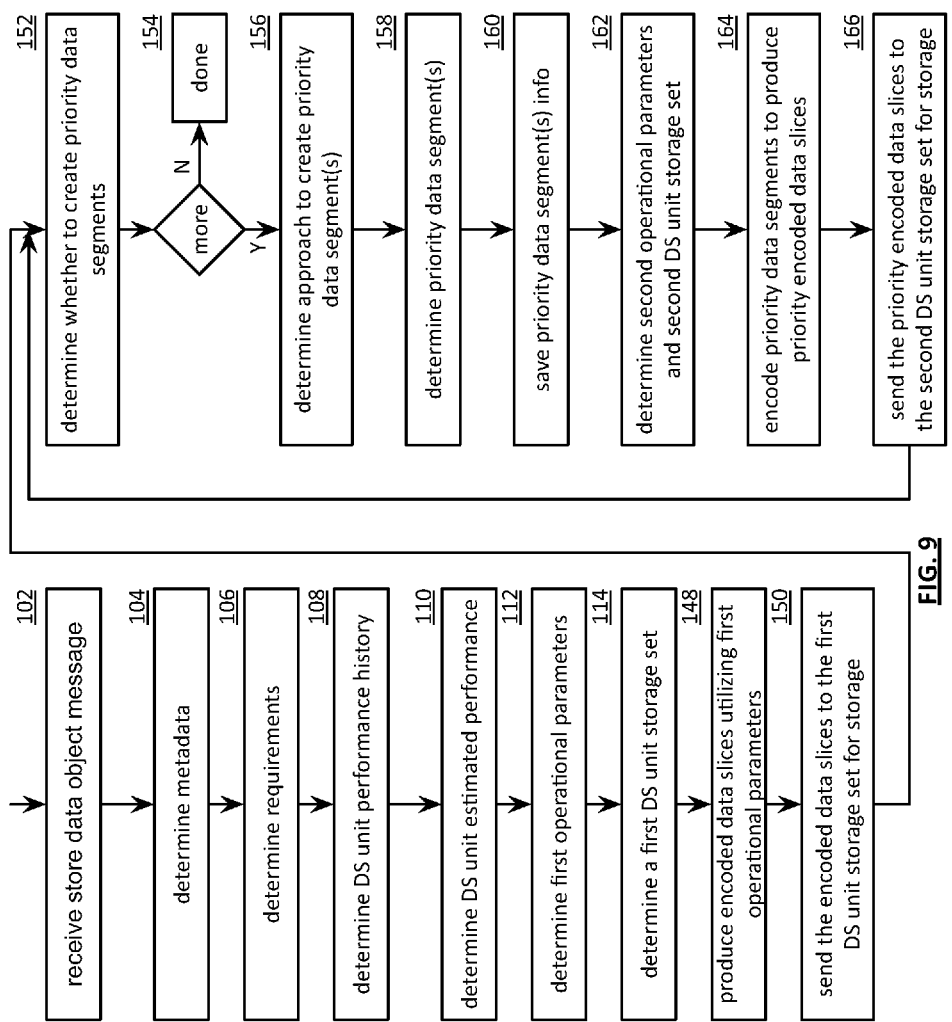
FIG. 9 is a flowchart illustrating an example of segmenting data in accordance with the invention.

FIG. 9 is a flowchart illustrating an example segmenting data, which includes some similar steps to FIG. 6. The method begins with steps 102-114 of FIG. 6 and then continues with step 148 where a processing module encodes data into a plurality of sets of encoded data slices in accordance with first error coding dispersal storage function parameters. Note that the processing module may encode all data (e.g., non-priority data and priority data) or the processing module encodes the non-priority data alone. For example, the processing module identifies non-priority data segments of the data and encodes the non-priority data segments into the plurality of sets of encoded data slices in accordance with the first error coding dispersal storage function parameters, wherein the first error coding dispersal storage function parameters include a first pillar width and a first decode threshold optimized for data recovery (e.g., retrieving and decoding) speed and non-optimal for data recovery reliability. The method continues at step 150 where the processing module outputs the plurality of sets of encoded data slices to the first dispersed storage (DS) unit storage set of a dispersed storage network (DSN) memory for storage therein. Next, the processing module updates a storage location table to associate the plurality of sets of encoded data slices with the data.

The method continues at step 152 where the processing module determines whether to create priority data segments (e.g., and store them in the DSN memory as encoded data slices) based on one or more of requirements, metadata, a data object, a determination of the priority/non-priority data, which data segments from the original segment set include priority data, a command, a predetermination, a lookup, DS unit performance history, and DS unit estimated performance. For example, the processing module determines to create more data segments when the metadata identifies priority data and when the performance history of the first DS unit storage set is unfavorable as compared to the requirements (e.g., the DS unit reliability history or DS unit estimated reliability is below a threshold). The method ends at step 154 when the processing module determines not to create priority data segments. The method continues to step 156 when the processing module determines to create priority data segments.

The continues at step 156 where the processing module determines an approach to create priority data segments based on one or more of the requirements, the data object, a determination of the priority/non-priority data, a size of the priority data, a location of the priority data, which data segments from the original segment set include priority data, a command, a predetermination, a lookup, DS unit performance history, and DS unit estimated performance. For example, the processing module determines to create a segment set R when the size of the priority data is substantially contained within a data segment of the original data segment set described above (e.g., without overlapping two or more data segments). Note that the processing module may utilize the data segments of the original segment set to produce (e.g., copy from a temporary memory) the data segments of the segment set R. As another example, the processing module determines to create a segment set P when the size of the priority data is substantially not contained within a data segment of the original data segment set (e.g., substantially overlapping two or more data segments).

The method continues at step 158 where the processing module determines priority data segments of the data. Such a determination includes at least one of identifying content of the data having a desired priority level, wherein data segments containing the content are identified as the priority data segments, determining a desired relationship between a data recovery speed and a data recovery reliability, and determining the priority data segments based on the desired relationship, receiving an indicator that identifies the priority data segments, and accessing a table regarding the data to identify the priority data segments. For example, the processing module copies the data segments from the original segment set that correspond to priority data of the data object when the approach is to form a segment set R of priority data segments. As another example, the processing module forms each priority data segment from the priority data sections of the data object when the approach is to form a segment set P of priority data segments that replicate the priority data. As yet another example, the processing module encodes video data into the plurality of sets of encoded data slices in accordance with the first error coding dispersal storage function parameters, wherein the plurality of set of encoded data slices is retrieved in response to a video on demand request and the processing module determines key frames of the video data as the priority data segments.

The method continues at step 160 where the processing module saves priority data segment information to facilitate subsequent retrieval where the priority data segment information may include one or more of a location of the priority data in the data object, a size of the priority data segments, a size of the priority data, and a number of priority data sections. For example, the processing module saves the priority data segment information as data appended to one or more of the priority data segments. As another example, the processing module saves the priority data segment information as a separate data object in the DSN memory as a plurality of sets of encoded priority data segment information slices.

The method continues at step 162 where the processing module determines second error coding dispersal storage function parameters (e.g., second operational parameters) and a second DS unit storage set based on one or more of the determined approach to create priority data segments, the priority data segments, the requirements, the metadata, the DS unit performance history, the DS unit estimated performance, the first DS unit storage set, the first error coding dispersal storage function parameters, the data object, a command, a predetermination, and a vault lookup. For example, the processing module determines the second error coding dispersal storage function parameters and the second DS unit storage set to be substantially identical to the first error coding dispersal storage function parameters and the first DS unit storage set when a nominal level of improved retrieval reliability is required. As another example, the processing module determines the second error coding dispersal storage function parameters and the second DS unit storage set to be substantially different from the first error coding dispersal storage function parameters and the first DS unit storage set. As a specific example, the processing module determines the second error coding dispersal storage function parameters to include a second pillar width and a second decode threshold optimized for data recovery reliability and non-optimal for data recovery speed when an improved level of retrieval reliability is required.

The method continues at step 164 where the processing module encodes the priority data segments in accordance with the second error coding dispersal storage function parameters to produce a plurality of sets of priority encoded data slices. The method continues at step 166 where the processing module outputs the plurality of sets of priority encoded data slices to the second DS unit storage set of the DSN memory for storage therein. Next, the processing module updates the storage location table to associate the plurality of sets of priority encoded data slices with the priority data segments. The method repeats back to step 152 to potentially create more priority and/or redundant data segments.

Figure 10:
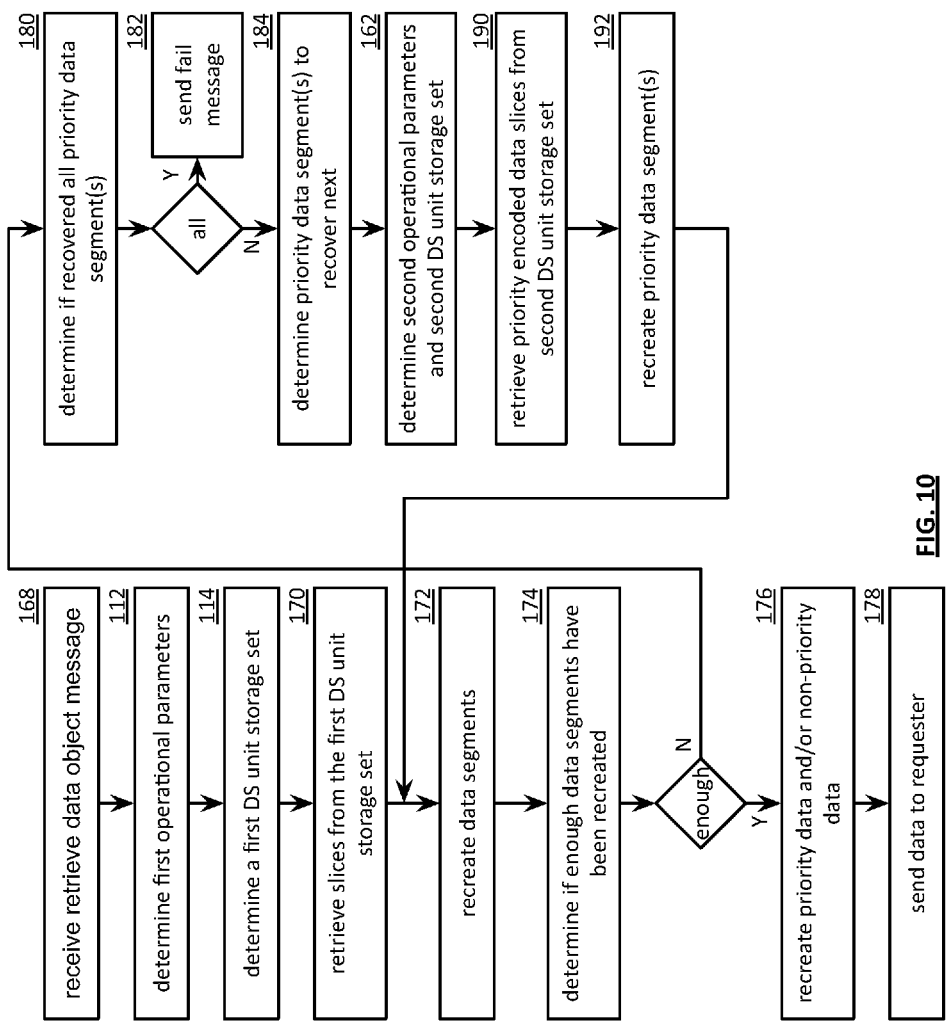
FIG. 10 is a flowchart illustrating an example of re-creating data in accordance with the invention.

FIG. 10 is a flowchart illustrating an example of re-creating data, which includes similar steps to FIG. 6 and FIG. 9. The method begins with step 168 where a processing module receives a retrieve data object message (e.g., from any one of a user device, a storage integrity processing unit, a dispersed storage (DS) processing unit, a DS managing unit, and a DS unit). The retrieve data object message includes one or more of a data object name, a data object size, a data type, an input metadata, a priority data indicator, a priority indicator, a security indicator, a performance indicator, and input requirements. The method continues at steps 112-114 of FIG. 6 and then continues with step 170 where the processing module retrieves a set of encoded data slices from a first DS unit storage set of a dispersed storage network (DSN) memory, wherein a data segment was encoded in accordance with first error coding dispersal storage function parameters to produce the set of encoded data slices.

The method continues at step 172 where the processing module determines whether the set of encoded data slices are associated with a data segment or a priority data segment to facilitate re-creating data segments. Such a determination may be based on one or more of accessing a storage location table to identify the set of encoded data slices with the data, accessing the storage location table to identify the second set of encoded data slices, the first error coding dispersal storage function parameters, an origin of retrieval of the set of encoded data slices, a command, a message, and a query. The processing module decodes the set of encoded data slices in accordance with the first error coding dispersal storage function parameters to produce the data segment when the data segment is not the priority data segment.

The processing module determines whether to decode the set of encoded data slices in accordance with the first error coding dispersal storage function parameters or to decode a second set of encoded data slices in accordance with second error coding dispersal storage function parameters when the data segment is the priority data segment, wherein the data segment was encoded in accordance with the second error coding dispersal storage function parameters to produce the second set of encoded data slices, wherein the first error coding dispersal storage function parameters include a first pillar width and a first decode threshold optimized for data recovery speed and non-optimal for data recovery reliability and the second error coding dispersal storage function parameters include a second pillar width and a second decode threshold optimized for data recovery reliability and non-optimal for data recovery speed.

Such determining whether to decode the set of encoded data slices or the second set of encoded data slices includes at least one of determining a desired relationship between the data recovery speed and the data recovery reliability, decoding the set of encoded data slices when the desired relationship compares favorably to a relationship threshold, and decoding the second set of encoded data slices when the desired relationship compares unfavorably to the relationship threshold, receiving an indicator that indicates whether to decode the set of encoded data slices or the second set of encoded data slices, and accessing a table based on identity of the data segment to determine whether to decode the set of encoded data slices or the second set of encoded data slices. For example, the processing module retrieves the set of encoded data slices in response to a video on demand request and determines whether the data segment corresponds to a key frame of video data. Next, the processing module identifies the data segment as a priority data segment and determines to decode the second set of encoded data slices when the data segment corresponds to the key frame (e.g., priority data).

The method continues at step 174 where the processing module determines if enough data segments have been re-created. Such a determination may be based on one or more of a comparison of the number of re-created data segments to a number of data segments of the data object, a vault lookup, a command, a message, a predetermination, a priority data indicator, metadata, and information received in the retrieve data object message. For example, the processing module determines that enough data segments have been received when all of the data segments have been received and metadata in the retrieve data object message indicated that all of the data segments are required for this retrieval transaction. As another example, the processing module determines that enough data segments have not been received when all of the data segments have not been received and metadata in the retrieve data object message indicates that all of the data segments are required for this retrieval transaction.

As yet another example, the processing module determines that enough data segments have been received when all of the data segments have not been received, data segments containing priority data have been received that contain all of the priority data, and metadata in the retrieve data object message indicates that only the priority data is required for this retrieval transaction. As a further example, the processing module determines that not enough data segments have been received when all of the data segments have not been received, not enough data segments containing priority data have been received such that at least some of the priority data has not been retrieved, and metadata in the retrieve data object message indicates that only the priority data is required for this retrieval transaction.

The method branches to step 180 when the processing module determines that enough data segments have not been received. The method continues to step 176 when the processing module determines that enough data segments have been received. The method continues at step 176 where the processing module re-creates priority data and/or non-priority data by aggregating the successfully re-created data segments and priority data segments. The method continues at step 178 where the processing module sends the data to the requester.

The method continues at step 180 where the processing module determines whether all of the priority data segments have been recovered (e.g., retrieving a segment set R and/or retrieving a segment set P and decoding the segments) based on one or more of previously recovered data segments, a vault lookup, a message, a command, and a list of segment sets tried. The method branches to step 184 when the processing module determines that all priority data segments have not been recovered. The method continues to step 182 when the processing module determines that all priority data segments have been recovered. The method continues at step 182 where the processing module sends a fail message to the requester and/or the DS managing unit.

The method continues at step 184 where the processing module determines additional priority data segments to try next based on one or more of previously recovered priority data segments, a vault lookup, a message, a command, and a list of segment sets recovered. For example, the processing module determines to recover an additional priority data segment set after trying to recover the original data segment set. As another example, the processing module determines to try segment set P after trying to retrieve the original data segment set and a priority segment set. The method continues at step 162 of FIG. 9.

The method continues at step 190 where the processing module sends a retrieve slice command to at least a DS unit of the second DS unit storage set to retrieve a second set of encoded data slices from a second DS unit storage set of the DSN memory. The processing module receives priority encoded data slices from at least one DS unit of the second DS unit storage set in response to the retrieve slice command. The processing module retrieves at least a read threshold number of encoded priority data slices from the second DS unit storage set corresponding to each of the desired priority data segments. The method continues at step 192 where the processing module dispersed storage error decodes the second set of encoded data slices in accordance with the second error coding dispersal function parameters to produce the priority data segment as a recovered data segment. The method repeats back to step 172 to fully re-create data segments and determine if enough data segments have been re-created to facilitate aggregating data segments to reproduce the data.

Figure 11:
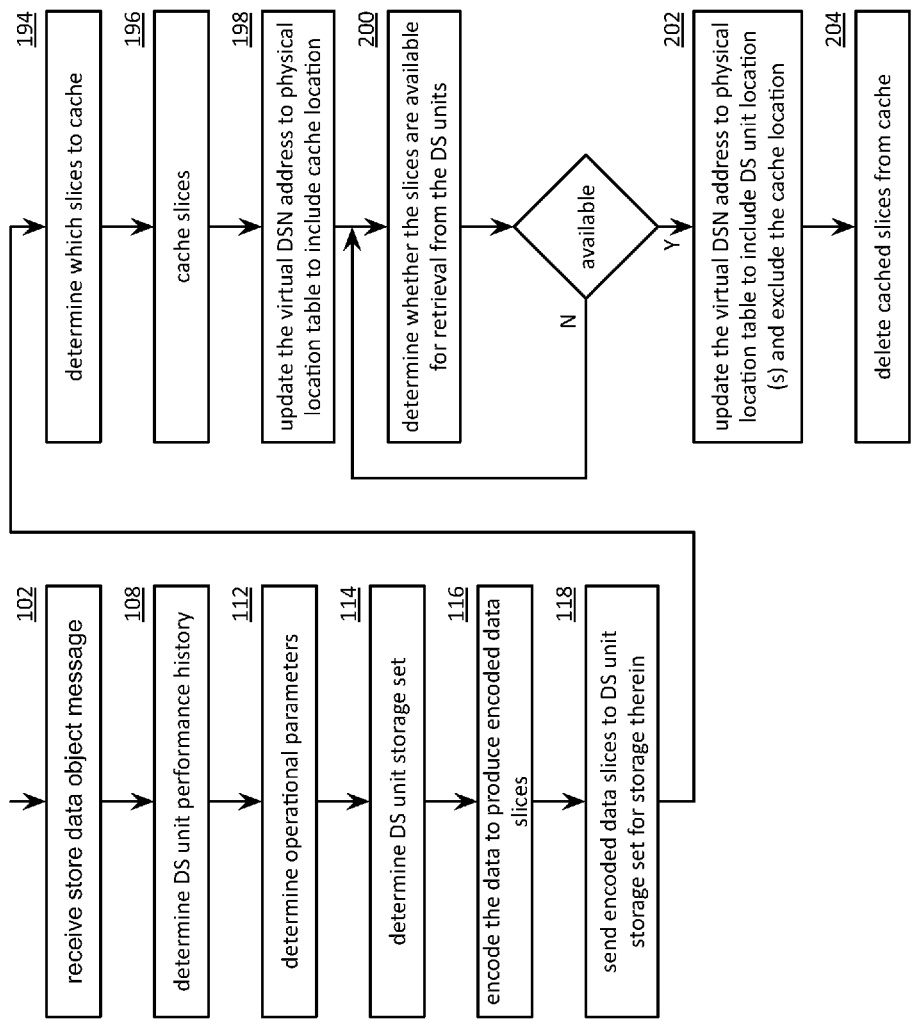
FIG. 11 is a flowchart illustrating an example of caching encoded data slices in accordance with the invention.

FIG. 11 is a flowchart illustrating an example of caching encoded data slices, which includes many steps similar to FIG. 6. The method begins with steps 102, 108, 112, 114, 116, 118 of FIG. 6 and then continues with step 194 where a processing module determines which encoded data slices to cache based on one or more of a comparison of dispersed storage (DS) unit access latency history to a threshold, DS unit performance history, a DS unit storage set, error coding dispersal storage function parameters, metadata, requirements, a vault lookup, a command, and information received in the store data object message. For example, the processing module determines the slices to cache when the slices correspond to the DS units with an access latency time performance that is above a threshold. Alternatively, the processing module skips step 108 to enable always caching the encoded data slices not subject to DS unit performance history.

The method continues at step 196 where the processing module caches the slices that are to be cached as cached encoded data slices. For example, the processing module determines to temporarily store the encoded data slices in one or more memories of one or more of a DS processing unit, a user device, a DS managing unit, a storage integrity processing unit, and a DS unit. The processing module determines cache location based on one or more of a candidate cache memory list, memory availability indicator, a size indicator of the encoded data slices to cache, a performance indicator of cache memory, requirements, the DS unit storage set, the error coding dispersal storage function parameters, a vault lookup, a command, a predetermination, and information received in the store data object message. As a specific example, the processing module caches the encoded data slices in a memory associated with a DS processing unit such that the encoded data slices are readily available for retrieval with a relatively low access latency. Alternatively, or in addition to, the processing module facilitates storage of the encoded data slice in temporary memory to produce a temporarily stored encoded data slice when estimated DS unit performance level compares unfavorably with a performance threshold, wherein the temporarily stored encoded data slice is retrieved in response to a retrieval request of the encoded data slice when confirmation of a DS unit storing the encoded data slice has not been received.

The method continues at step 198 where the processing module updates a storage location table (e.g., a virtual dispersed storage network (DSN) address to physical location table) to associate a slice name with a temporary memory identifier (ID) of the temporary memory. For example, the processing module updates the virtual DSN address to physical location table to include pillars 1-9 as stored in DS units 1-9, pillar 10 as stored in a DS processing unit cache memory, and pillars 11-16 is stored in DS units 11-16 when the pillar width is 16 and the read threshold is 10.

The method continues at step 200 where the processing module determines whether the slices are available for retrieval from the DS units based on receiving a response from the DS units, wherein the response indicates that the encoded data slices are available for retrieval. The method advances to step 202 when the processing module determines that the slices are available for retrieval from the DS units. The method continues at step 202 where the processing module updates a storage location table (e.g., the virtual DSN address to physical location table) to associate slice names of the encoded data slices with DS unit IDs of the DS unit storage set and to delete an association of the slice names with the temporary memory ID of the temporary memory. The method continues at step 204 where the processing module facilitates deleting of the cached encoded data slices from the temporary memory.

In an example of operation of a corresponding retrieval sequence, the processing module receives a retrieve data object message from a requester and determines DS unit locations based on a lookup of the virtual DSN address to physical location table. Note that the table may indicate a combination of DS units and or cache memory locations for at least some of encoded data slices to be retrieved. The processing module determines error coding dispersal storage function parameters based on a vault lookup. The processing module retrieves the encoded data slices from the determined locations dispersed storage error decodes the encoded data slices to produce data segments in accordance with the error coding dispersal storage function parameters. The processing module aggregates the data segments to produce the data object. The processing module sends the data object to the requester.

Figure 12:
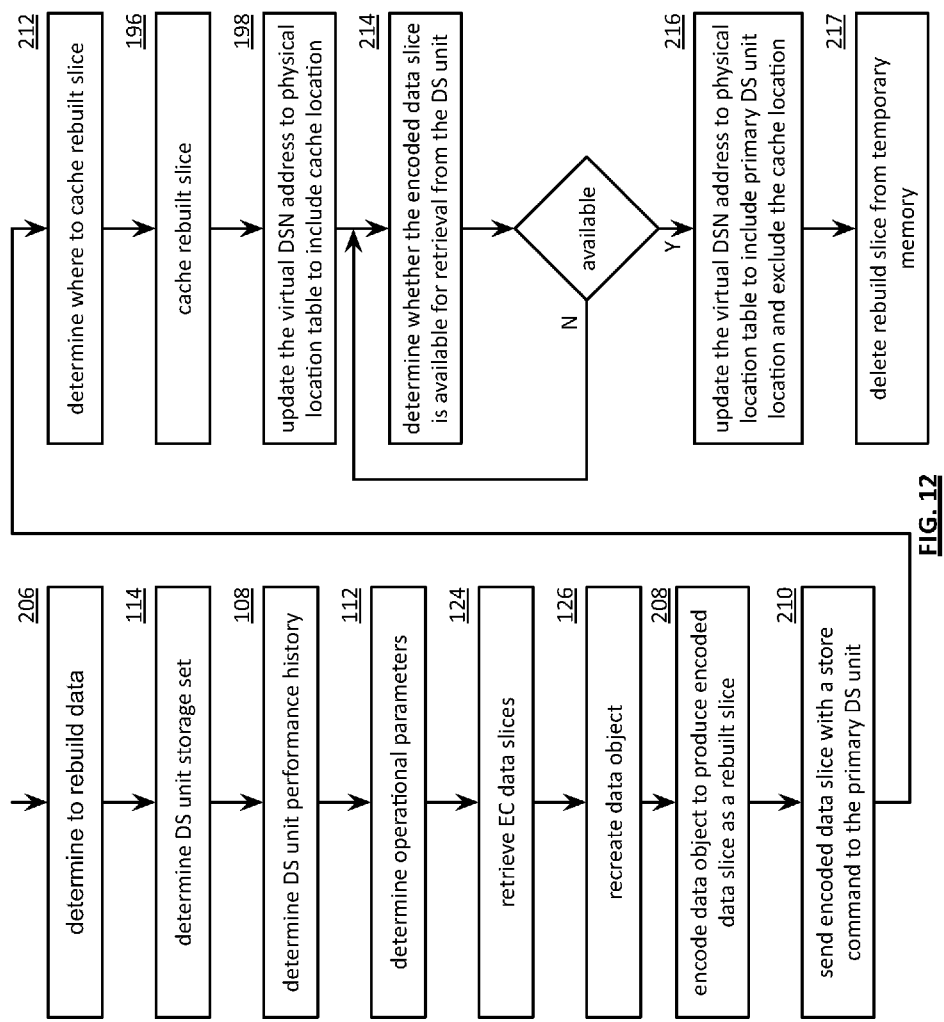
FIG. 12 is a flowchart illustrating an example of caching rebuilt encoded data slices in accordance with the invention.

FIG. 12 is a flowchart illustrating an example of caching rebuilt encoded data slices which includes many similar steps to FIGS. 6, 7, and 11. The method begins with step 206 where a processing module determines to rebuild data where the data may be at least a portion of a data object stored as encoded data slices in a dispersed storage network (DSN) memory. Such a determination may be based on one or more of detection of a missing slice, detection of a corrupted slice, detection of a tampered slices, detection of a failed memory device, detection of a failed DS unit, detection of a failed site, a message, a command, and a DS unit query. For example, the processing module receives a message from a DS unit indicating that one of four hard drive memories has failed and has been replaced with a new hard drive memory. The method continues with steps 114, 108, and 112 of FIG. 6. The method continues with steps 124-126 of FIG. 7 to reproduce a data object corresponding to at least an encoded data slice to be rebuilt. Note that the processing module may obtain an encoded data slice and an associated slice name for storage in a DS unit and/or a temporary memory wherein the obtaining the encoded data slice comprises at least one of receiving the encoded data slice, creating the encoded data slice, rebuilding the encoded data slice from a set of associated encoded data slices, and receiving the encoded data slice as a rebuilt encoded data slice that was rebuilt from the set of associated encoded data slices.

The method continues at step 208 where the processing module dispersed storage error encodes a data segment associated with the portion of the data object to be rebuilt to produce an encoded data slice as a rebuilt slice in accordance with error coding dispersal storage function parameters. The method continues at step 210 where the processing module sends the encoded data slice to an associated DS unit of a DS unit storage for storage therein. Alternatively, the processing module sends the encoded data slice through the associated DS unit subsequent to step 196 where the processing module caches the rebuilt slice.

The method continues at step 212 where the processing module determines a temporary memory based on at least one of a slice name, a size of the encoded data slice, a comparison of DS unit access latency history to a threshold, a DS unit performance history, the DS unit storage set, the error coding dispersal storage function parameters, metadata, requirements, a vault lookup, a command, and information obtained associated with the encoded data slice, wherein the temporary memory includes one or more of another DS unit, local memory, cache memory, and main memory. The method continues at step 196 of FIG. 11 to cache the rebuilt slice in the temporary memory. The method continues at step 198 of FIG. 11.

The method continues at step 214 where the processing module determines whether the slice is available for retrieval from the DS unit based on receiving a response from the DS unit, wherein the response indicates that the encoded data slice is available for retrieval. The method advances to step 216 when the processing module determines that the slice is available for retrieval from the DS unit. The method continues at step 216 where the processing module updates a storage location table (e.g., the virtual DSN address to physical location table) to associate the slice name of the encoded data slice with a DS unit ID of the DS unit and to delete an association of the slice name with the temporary memory ID of the temporary memory. The method continues at step 217 where the processing module facilitates deleting of the cached encoded data slice from the temporary memory.

Figure 13:
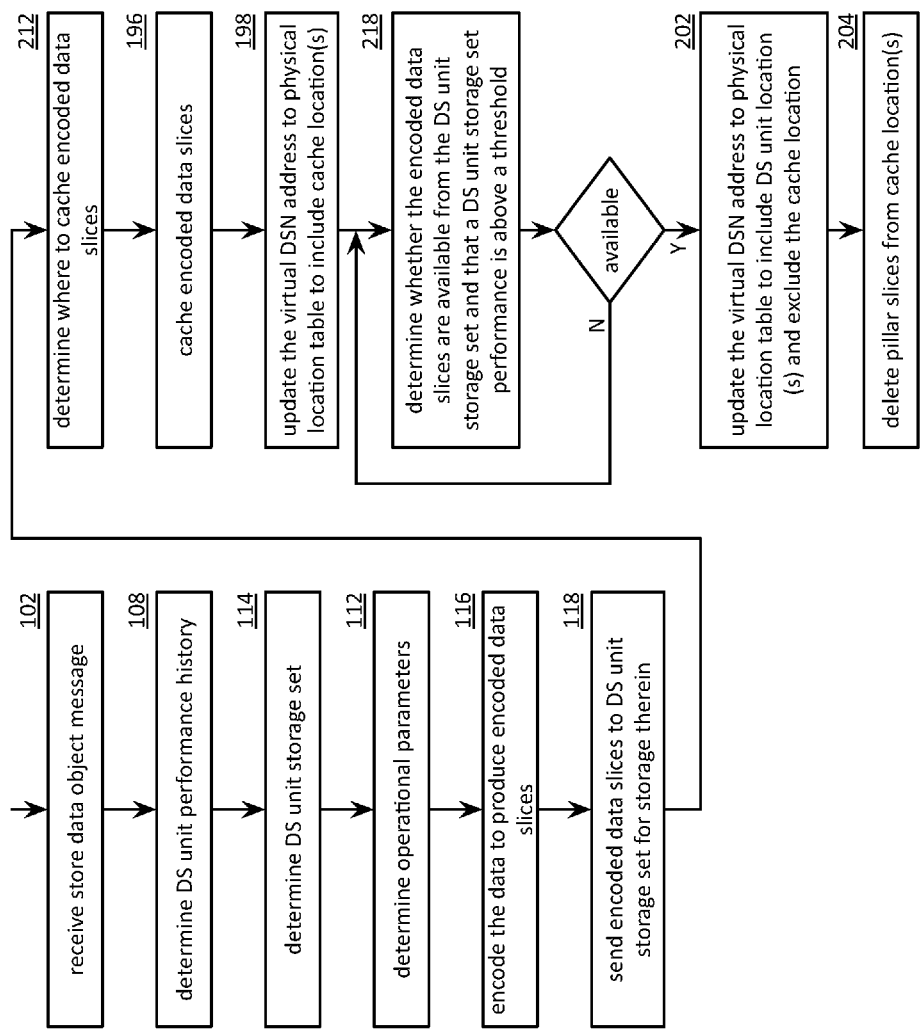
FIG. 13 is a flowchart illustrating another example of caching encoded data slices in accordance with the invention.

FIG. 13 is another flowchart illustrating another example of caching encoded data slices, which includes many similar steps to FIGS. 6, 11, and 12. The method begins with steps 102, 108, 114, 112, 116, and 118 of FIG. 6 to produce encoded data slices and to send encoded data slices to a DS unit storage set for storage therein. The method continues with step 212 of FIG. 12 and then steps 196-198 of FIG. 11 to cache the encoded data slices as temporarily stored encoded data slices. The method continues at step 218 where the processing module determines whether the encoded data slice are available for retrieval from the DS unit storage set based on receiving response from the DS units, wherein the responses indicates that a corresponding encoded data slice is available for retrieval and that a DS unit storage set performance is above a threshold based on performance indicator. The method advances to steps 202-204 of FIG. 11 when the processing module determines that the encoded data slices are available for retrieval from the DS unit storage set and that the DS unit storage set performance is above the threshold.

In a retrieval example of operation, the processing module receives a retrieval request and determines whether to retrieve a temporarily stored encoded data slice from the temporary memory or an encoded data slice from the DS unit in response to the retrieval request. Such a determination may be based on one or more of a DS unit performance indicator, system performance indicator, the DS unit reliability indicator, and an access latency estimate. Next, the processing module sends a read request to a DS unit of the DS unit storage set regarding retrieval of the encoded data slice when selecting the encoded data slice from the DS unit in response to the retrieval request.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A computer readable storage medium comprises:
    a first memory section storing operational instructions that, when executed by a computing device, causes the computing device to:
        determine a performance based indication regarding storage of a data segment as a set of encoded data slices;
    a second memory section storing operational instructions that, when executed by the computing device, causes the computing device to:
        compare the performance based indication with a performance threshold; and
    a third memory section storing operational instructions that, when executed by the computing device, causes the computing device to:
    when the performance based indication compares unfavorably with the performance threshold:
        decode the set of encoded data slices in accordance with error coding dispersal storage function parameters to reproduce the data segment;
        adjust the error coding dispersal storage function parameters based on the unfavorable comparison of the performance based indication with the performance threshold to produce performance adjusted error coding dispersal storage function parameters;
        encode the reproduced data segment in accordance with the performance adjusted error coding dispersal storage function parameters to produce a second set of encoded data slices; and
        select a storage set of encoded data slices from the set of encoded data slices and the second set of encoded data slices based on a difference between the performance adjusted error coding dispersal storage function parameters and the error coding dispersal storage function parameters.

2. The computer readable storage medium of claim 1 further comprises:
    a fourth memory section storing operational instructions that, when executed by the computing device, causes the computing device to:

update a storage location table to associate a corresponding slice name of a set of slice names with a corresponding encoded data slice of the storage set of encoded data slices.

3. The computer readable storage medium of claim 1 further comprises:
a fourth memory section storing operational instructions that, when executed by the computing device, causes the computing device to:
output each of the encoded data slices of the storage set of encoded data slices that is selected from the second set of encoded data slices to a dispersed storage network (DSN) memory for storage therein.

4. The computer readable storage medium of claim 1, wherein the third memory section further stores operational instructions that, when executed by the computing device, causes the computing device to adjust the error coding dispersal storage function parameters by:
determining desired error coding dispersal storage function parameters based on the performance threshold and the performance based indication;
determining a difference between the desired error coding dispersal storage function parameters and the error coding dispersal storage function parameters to produce a parameters difference; and
adjusting the error coding dispersal storage function parameters based on the parameters difference, wherein determining at least one of the desired error coding dispersal storage function parameters and the parameters difference is based on at least one of: a set of dispersed storage (DS) units, the error coding dispersal storage function parameters, a vault lookup, a command, a message, a predetermination, a DS unit query, a historical DS unit performance level, an estimated DS unit performance level, storage requirements, and metadata.

5. The computer readable storage medium of claim 1, wherein the third memory section further stores operational instructions that, when executed by the computing device, causes the computing device to:
when the performance based indication compares unfavorably with the performance threshold as a result of underperformance, adjust the error coding dispersal storage function parameters by:
increase a difference between a decode threshold and a pillar width; and
adjust an encoding matrix in accordance with the increasing of the difference.

6. The computer readable storage medium of claim 1, wherein the third memory section further stores operational instructions that, when executed by the computing device, causes the computing device to:
when the performance based indication compares unfavorably with the performance threshold as a result of over-performance, adjust the error coding dispersal storage function parameters by:
decrease a difference between a decode threshold and a pillar width; and
adjust an encoding matrix in accordance with the decreasing of the difference.

7. The computer readable storage medium of claim 1, wherein the third memory section further stores operational instructions that, when executed by the computing device, causes the computing device to select the storage set of encoded data slices by:
selecting the set of encoded data slices; and
selecting at least one encoded data slice of the second set of encoded data slices.

8. A computer readable storage medium comprises:
a first memory section storing operational instructions that, when executed by a computing device, causes the computing device to:
determine that storage of data requires updating, wherein the data is encoded in accordance with a dispersed storage error encoding function using dispersed storage error encoding parameters to produce a plurality of sets of encoded data slices, which is stored in memory of a dispersed storage network (DSN), wherein the dispersed storage error encoding parameters includes a total number of encoded data slices per set of encoded data slices and a decode threshold number of encoded data slices that are required from a set of encoded data slices to recover a data segment of the data;
a second memory section storing operational instructions that, when executed by the computing device, causes the computing device to:
for a first type of updating of the storage of the data:
increase the total number while maintaining the decode threshold number;
for each of the sets of encoded data slices of the plurality of sets of encode data slices:
create at least one more encoded data slice in accordance with the dispersed storage error encoding function and the increased total number; and
send the at least one more encoded data slice to the memory of the DSN for storage therein; and
a third memory section storing operational instructions that, when executed by the computing device, causes the computing device to:
for a second type of updating of the storage of the data:
increase the total number and increasing the decode threshold number;
recover the data from retrieved encoded data slices of the plurality of sets of encoded data slices;
encode the recovered data in accordance with the dispersed storage error encoding function using the increased total number and the increased decode threshold number to produce an updated plurality of sets of encoded data slices; and
send the updated plurality of sets of encoded data slices to the memory of the DSN for storage therein.

9. The computer readable storage medium of claim 8, wherein the first memory section storing operational instructions that, when executed by the computing device, causes the computing device to determine that storage of data requires updating by one of:
determining under performance of the DSN with respect to accessing the plurality of sets of encoded data slices; and
determining over performance of the DSN with respect to accessing the plurality of sets of encoded data slices.

10. The computer readable storage medium of claim 8 further comprises:
a fourth memory section storing operational instructions that, when executed by the computing device, causes the computing device to:
for a third type of updating of the storage of the data:
decrease the total number while maintaining the decode threshold number;
for each of the sets of encoded data slices of the plurality of sets of encode data slices:
select at least one encoded data slice based on the decreased total number and the total number; and delete the selected at least one encoded data slice from the memory of the DSN.

11. The computer readable storage medium of claim 8 further comprises:
a fourth memory section storing operational instructions that, when executed by the computing device, causes the computing device to:
for a third type of updating of the storage of the data:
decrease the decode threshold number and maintaining the total number;
recovering the data from retrieved encoded data slices of the plurality of sets of encoded data slices;
encode the recovered data in accordance with the dispersed storage error encoding function using the total number and the decreased decode threshold number to produce another updated plurality of sets of encoded data slices; and
send the other updated plurality of sets of encoded data slices to the memory of the DSN for storage therein.

12. The computer readable storage medium of claim 8 further comprises:
a fourth memory section storing operational instructions that, when executed by the computing device, causes the computing device to:
for a third type of updating of the storage of the data:
decrease the decode threshold number and decreasing the total number;
recover the data from retrieved encoded data slices of the plurality of sets of encoded data slices;
encode the recovered data in accordance with the dispersed storage error encoding function using the decreased total number and the decreased decode threshold number to produce another updated plurality of sets of encoded data slices; and
send the other updated plurality of sets of encoded data slices to the memory of the DSN for storage therein.

13. The computer readable storage medium of claim 8, wherein the first memory section storing operational instructions that, when executed by the computing device, causes the computing device to:
determine the type of updating based on a comparison of a performance based indication with a performance threshold.

14. The computer readable storage medium of claim 8, wherein the second memory section storing operational instructions that, when executed by the computing device, causes the computing device to:
for each of the at least one more encoded data slice created for the first type of updating of the storage of the data:
create a slice name to links the at least one more encoded data slice to a correspond set of encoded data slices of the plurality of sets of encoded data slices; and
update a storage location table to include the slices names.

15. The computer readable storage medium of claim 8, wherein the second memory section storing operational instructions that, when executed by the computing device, causes the computing device to send the at least one more encoded data slice to the memory of the DSN by:
identifying storage units of the DSN that are storing the plurality of sets of encoded data slices;
selecting at least one more storage unit of the DSN; and
sending the at least one more encoded data slice of each of the plurality of sets of encoded data slices to the selected at least one more storage unit.

16. The computer readable storage medium of claim 8, wherein the third memory section storing operational instructions that, when executed by the computing device, causes the computing device to send the updated plurality of sets of encoded data slices to the memory of the DSN by:
selecting storage units of the DSN; and
sending the updated plurality of sets of encoded data slices to the selected storage units.

* * * * *